(12) United States Patent
Wen et al.

(10) Patent No.: US 11,817,354 B2
(45) Date of Patent: *Nov. 14, 2023

(54) LOCAL GATE HEIGHT TUNING BY CMP AND DUMMY GATE DESIGN

(71) Applicant: Taiwan Semiconductor Manufacturing Co., Ltd., Hsin-Chu (TW)

(72) Inventors: Ming-Chang Wen, Kaohsiung (TW); Chang-Yun Chang, Taipei (TW); Keng-Yao Chen, Hsinchu (TW); Chen-Yu Tai, Hsinchu (TW); Yi-Ting Fu, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/884,324

(22) Filed: Aug. 9, 2022

(65) Prior Publication Data

US 2022/0384262 A1    Dec. 1, 2022

Related U.S. Application Data

(63) Continuation of application No. 17/125,299, filed on Dec. 17, 2020, now Pat. No. 11,508,623.

(Continued)

(51) Int. Cl.
*H01L 21/00*    (2006.01)
*H01L 21/8234*   (2006.01)

(Continued)

(52) U.S. Cl.
CPC .. *H01L 21/82345* (2013.01); *H01L 21/30625* (2013.01); *H01L 21/3212* (2013.01);
(Continued)

(58) Field of Classification Search
CPC ........... H01L 21/30625; H01L 21/3212; H01L 21/823456; H01L 21/82345; H01L 29/66545
See application file for complete search history.

(56) References Cited

U.S. PATENT DOCUMENTS 8,772,109 B2    7/2014 Colinge
8,785,285 B2    7/2014 Tsai et al.
(Continued)

*Primary Examiner* — Reema Patel
(74) *Attorney, Agent, or Firm* — HAYNES AND BOONE, LLP

(57) ABSTRACT

The present disclosure describes fabricating devices with tunable gate height and effective capacitance. A method includes forming a first metal gate stack in a dummy region of a semiconductor substrate, the first metal gate stack including a first work function metal (WFM) layer; forming a second metal gate stack in an active device region of the semiconductor substrate, the second metal gate stack including a second WFM layer different than the first WFM layer; and performing a CMP process using a slurry including charged abrasive nanoparticles. The charged abrasive nanoparticles include a first concentration in the active device region different from a second concentration in the dummy region causing different polish rates in the active device region and dummy region. After the performing of the CMP process, the first metal gate stack has a first height different from a second height of the second metal gate stack.

20 Claims, 15 Drawing Sheets

Related U.S. Application Data

(60) Provisional application No. 62/955,734, filed on Dec. 31, 2019.

(51) Int. Cl.
    *H01L 21/321*      (2006.01)
    *H01L 29/66*      (2006.01)
    *H01L 21/306*      (2006.01)

(52) U.S. Cl.
    CPC .............. *H01L 21/823431* (2013.01); *H01L 21/823456* (2013.01); *H01L 29/66545* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 11,508,623 B2 * | 11/2022 | Wen .................... H01L 21/3212 |
| 2005/0118821 A1 * | 6/2005 | Minamihaba ........ C09K 3/1463 |
| | | 257/E21.583 |
| 2019/0035801 A1 | 1/2019 | Wu et al. |

* cited by examiner

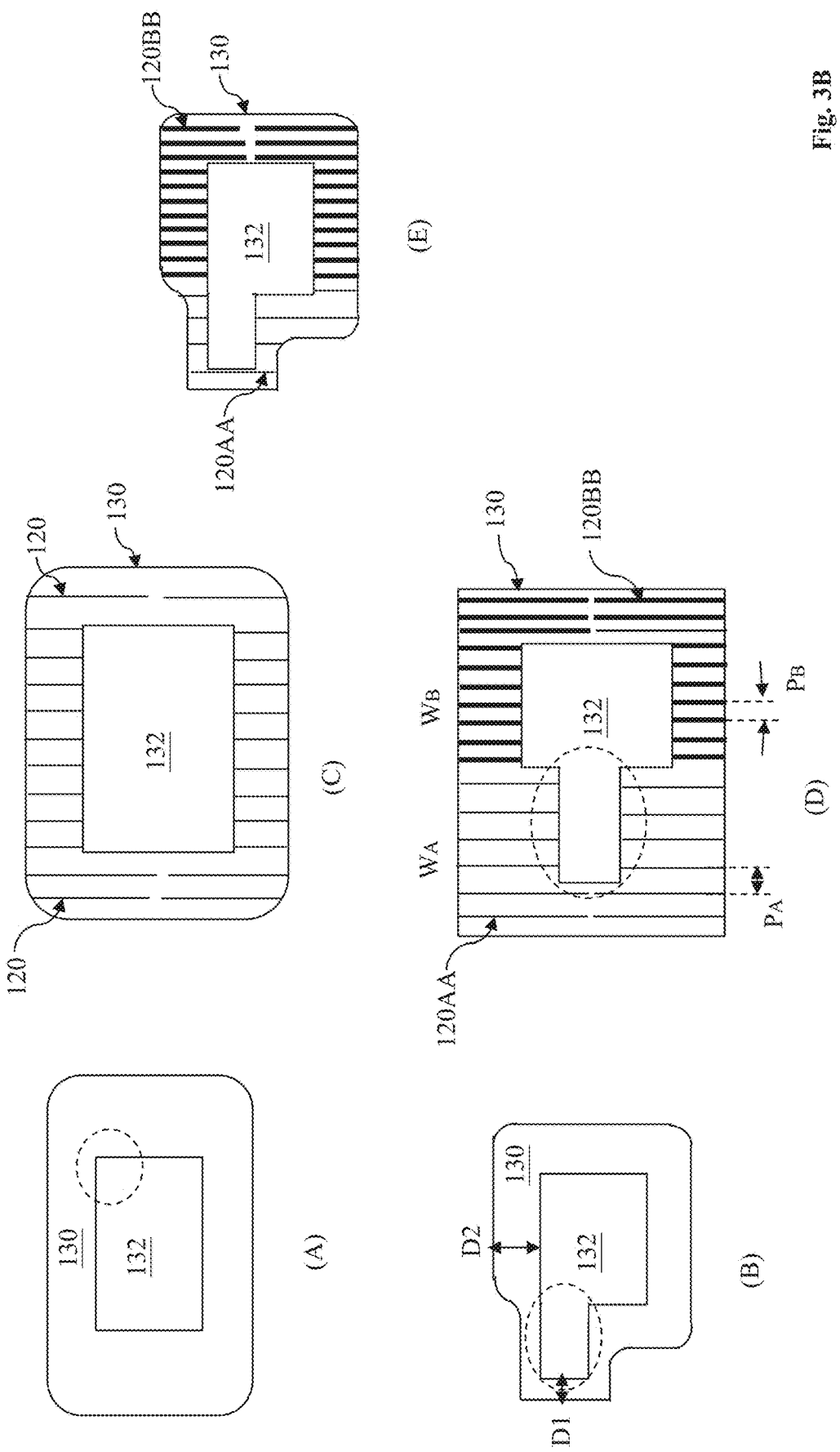

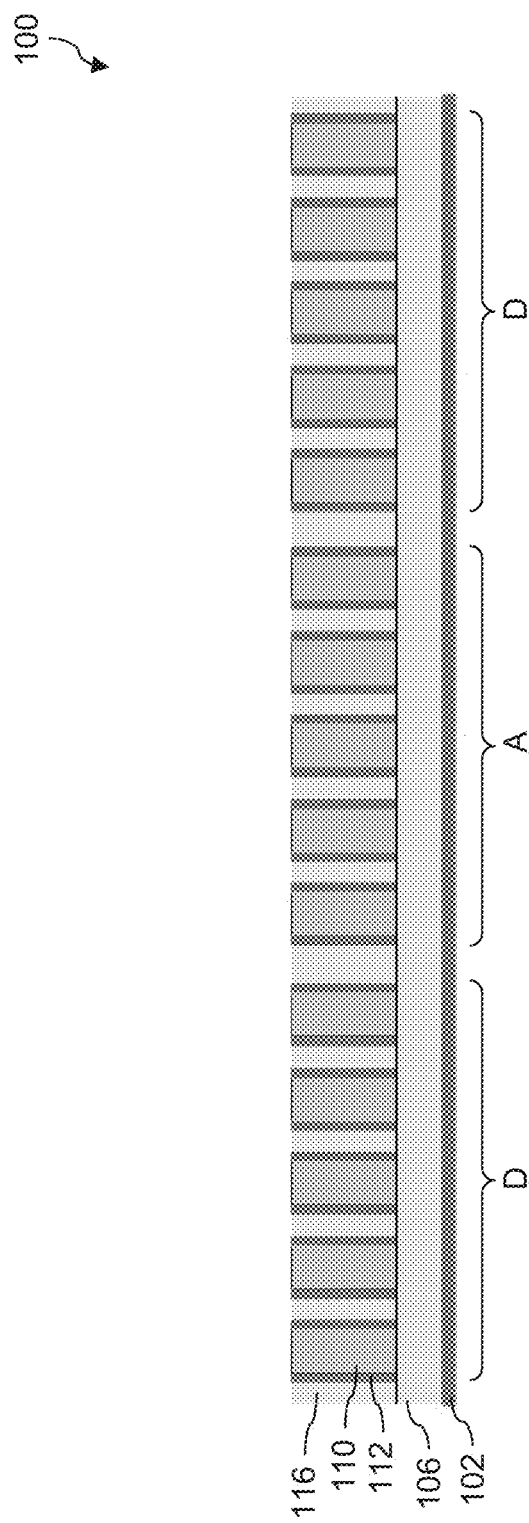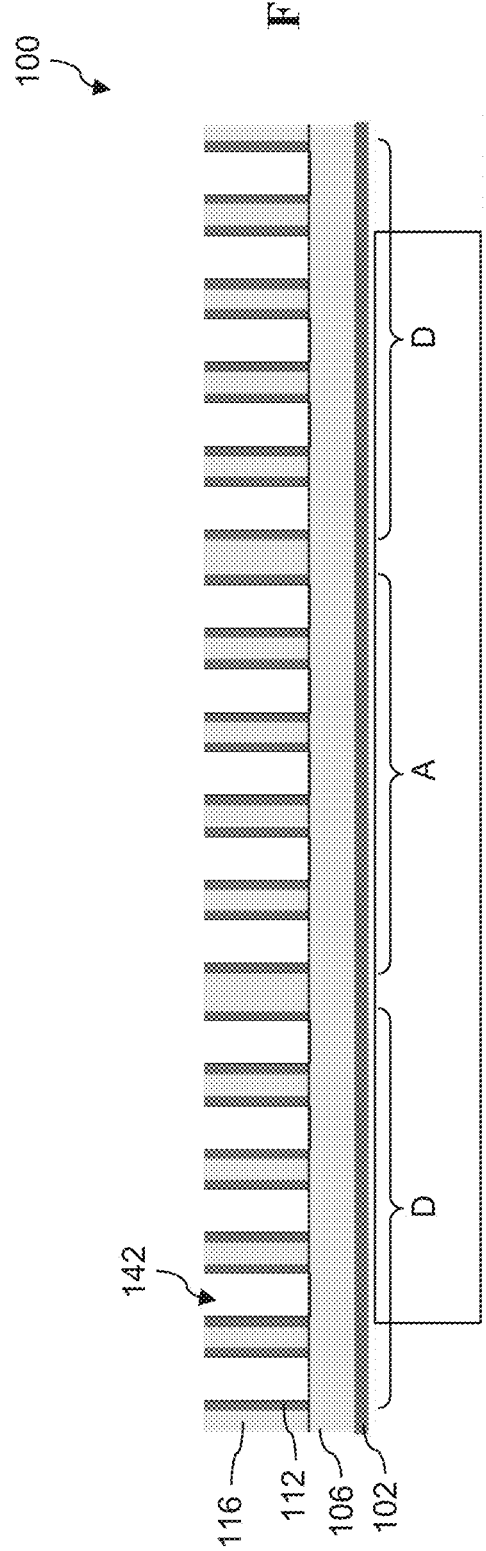

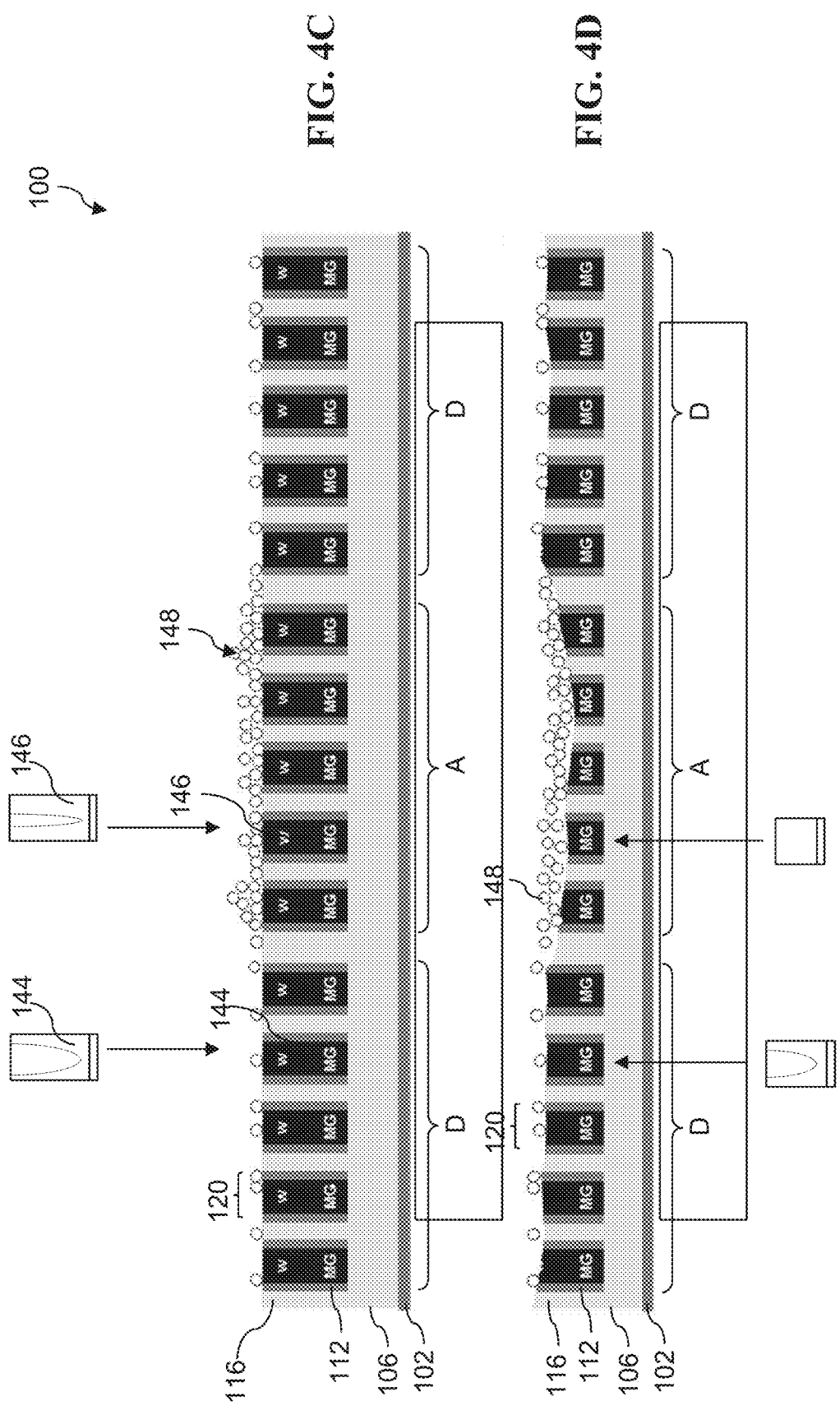

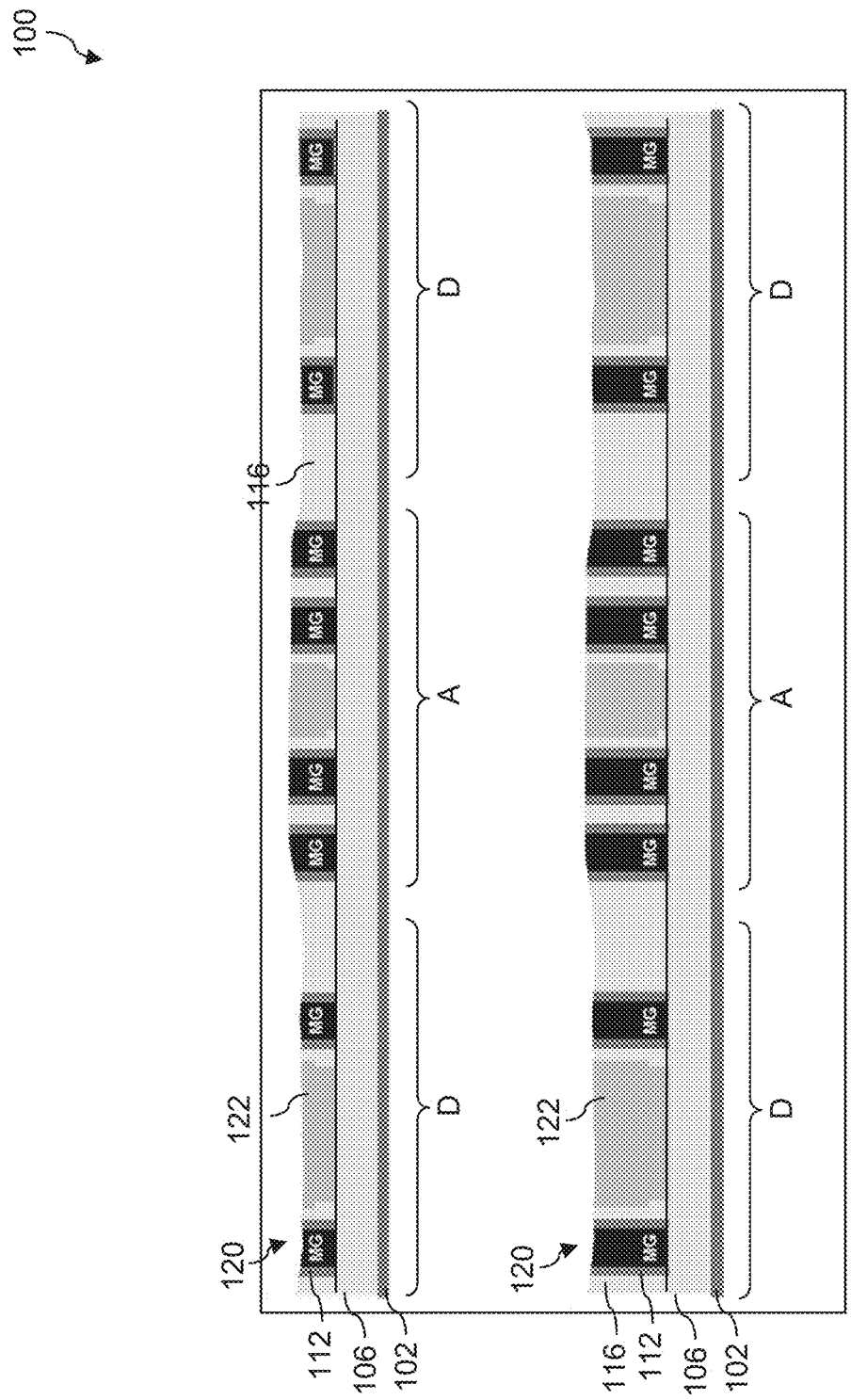

LOCAL GATE HEIGHT TUNING BY CMP AND DUMMY GATE DESIGN

CROSS-REFERENCE TO RELATED APPLICATIONS

This is a continuation application of U.S. patent application Ser. No. 17/125,299, filed on Dec. 17, 2020, which is a non-provisional application of and claims priority to U.S. Provisional Patent Application Ser. No. 62/955,734, filed Dec. 31, 2019, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, high-K metal gates have been implemented to reduce gate leakage current, poly-silicon gate depletion, and other issues associated with continued down-scaling. However, methods using cut poly and cut poly CMP cannot offer tuning of gate height. Furthermore, cut poly CMP is not a final gate height decisive process and any gate height variation or loading will impact replacement metal gate process window. After replacement metal gate process, additional process steps can affect local topography. Methods to provide improved tuning of gate height in today's ever-smaller devices remains a challenge.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3B is a top view of a semiconductor structure in portion, according to various embodiments.

FIG. 4A is a side section view of a semiconductor structure at a stage during a fabrication process in accordance with some embodiments.

FIG. 4B is a side section view of the semiconductor structure at a stage during the fabrication process in accordance with some embodiments.

FIG. 4C is a side section view of the semiconductor structure before performing a chemical mechanical polishing (CMP) process illustrating metal gates in a dummy region including a high ratio of tungsten (W) in accordance with some embodiments.

FIG. 4D is a side section view of the semiconductor structure of FIG. 4C after performing the CMP process using a negatively charged abrasive in accordance with some embodiments.

FIG. 8A is a side section view of a semiconductor structure after performing a CMP process using a first combination of slurry type and cut metal gate (CMG) fill material illustrating effect on removal rate in accordance with some embodiments.

FIG. 8B is a side section view of a semiconductor structure after performing a CMP process using a second combination of slurry type and CMG fill material illustrating effect on removal rate in accordance with some embodiments.

DETAILED DESCRIPTION

Figure 1:
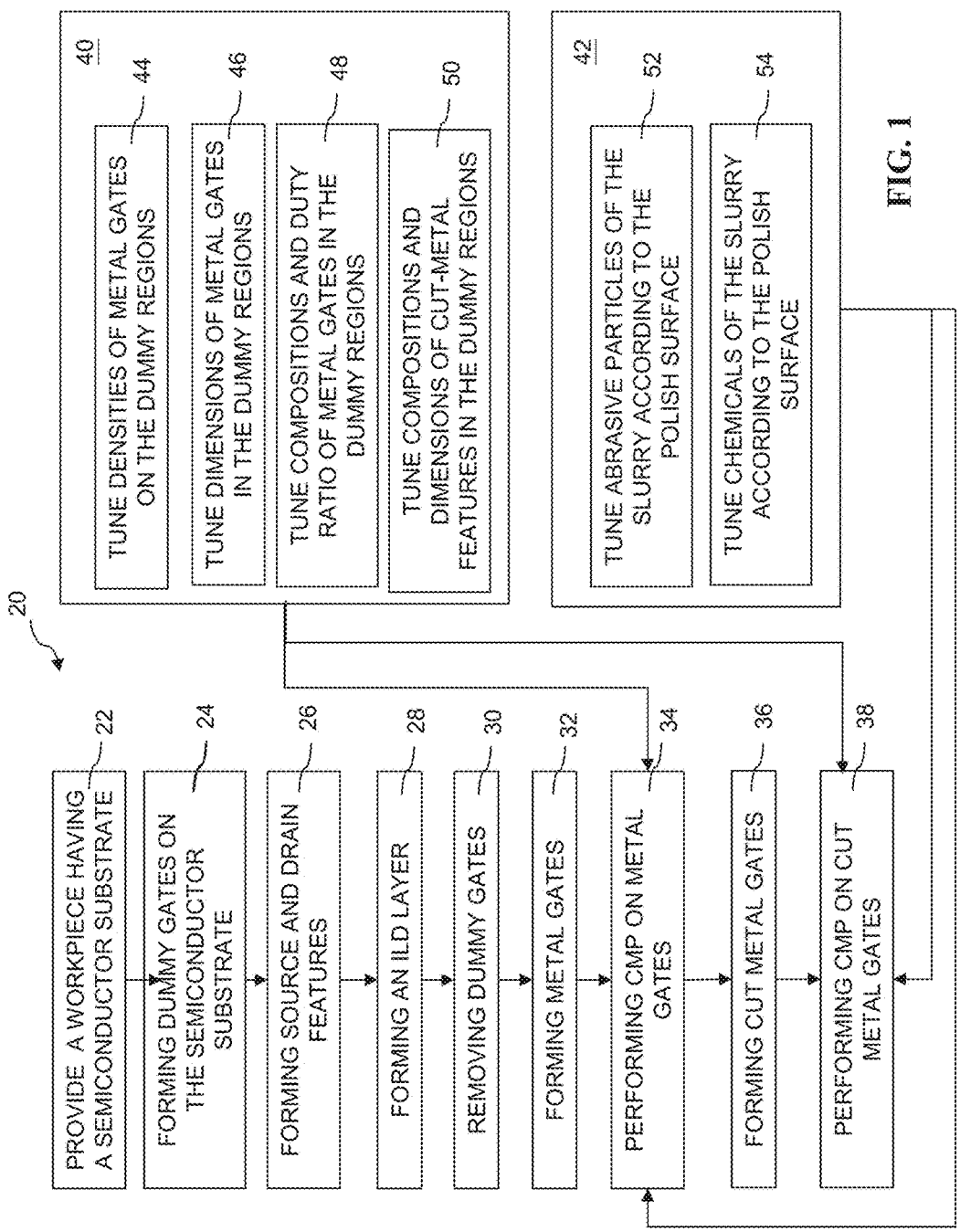
FIG. 1 is a flow chart illustrating a method of forming a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication methods, and more particularly to fabricating devices with tunable gate height and effective capacitance ($C_{eff}$). In some implementations, gate height and $C_{eff}$ have a positive proportional relationship, or in other words, decreasing gate height decreases $C_{eff}$. In some implementations, tuning $C_{eff}$ can provide a local device with greater degree of freedom for speed tuning. In some implementations, gate height tuning can be used for multiple advanced technology nodes and is applicable for N5, N3, N2, and beyond. In some implementations, gate height tuning is applicable to logic and SRAM devices and all IP blocks. In some implementations, local gate height may be tunable during metal gate chemical mechanical polishing (CMP) and cut metal gate (CMG) CMP. In some implementations local gate height may be tunable by slurry polish rate, abrasive charge, CMG fill material, and environmental dummy gate and cut metal gate design. In some implementations, CMP slurry polish rates may be tunable for TiN (p-type metal), W (p-type metal), Al (n-type metal), $SiO_2$, and SiN (dielectric). In some implementations, interaction of CMG fill material and CMP slurry polish rate can cause environmental dummy gate effect on active gate height. In some implementations, interaction of CMP abrasive and CMG fill material based on behavior of positively and negatively charged abrasive nanoparticles can cause additional environmental dummy gate effect on active gate height.

FIG. 1 is a flowchart of a method 20 fabricating a semiconductor device structure having field-effect transistors (FETs), wherein each of the FETs further includes a gate stack (or simply gate) coupled with the channel of the corresponding FET. Gate height is a sensitive factor, related to effective capacitance and circuit RC delay. The disclosed method provides an effect method for tuning the gate height locally on either direction (higher or lower) according to the circuit timing consideration of the integrated circuit.

FIGS. 2A-2D are perspective views of a semiconductor structure 100 at various stages during a fabrication process in accordance with some embodiments. The method 20 is described below with reference to FIGS. 1 and 2A-2D.

Figure 2A:
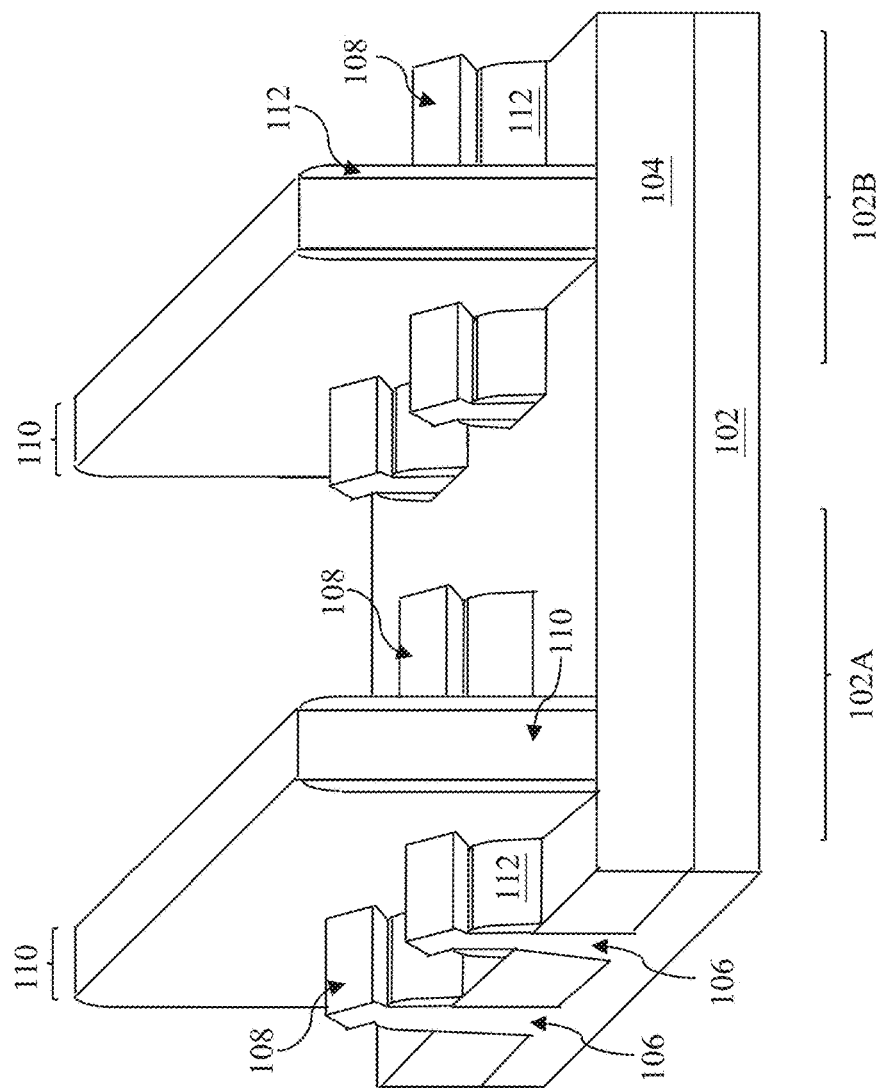
FIGS. 2A, 2B, 2C and 2D are perspective views of the semiconductor structure at various fabrication stages in accordance with some embodiments.

Referring to FIGS. 1 and 2A, the method 20 includes a block 22 by providing a workpiece (or a semiconductor device structure) 100 having a semiconductor substrate 102. The semiconductor substrate 102 includes a first region 102A (such as for p-type FETs or PFETs) and a second region 102B (such as for n-type FETs or NFETs). The semiconductor substrate 102 includes silicon. In some other embodiments, the substrate 102 includes germanium, silicon germanium or other proper semiconductor materials. The substrate 102 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor substrate 102 may also include various doped regions such as n-type doped wells and p-type doped wells. In some embodiments, the semiconductor substrate 102 may include a semiconductor on insulator (SOI) structure formed by a proper technique, such as smart-cut or technology referred to as separation by implanted oxygen (SIMOX).

The semiconductor structure 100 includes various isolation features 104, such as shallow trench isolation (STI) features. The semiconductor structure 100 also includes various active regions 106, such as fin active regions, formed on the semiconductor substrate 102. The fin active regions 106 are extruded above the isolation features 104 and are surrounded and isolated from each other by the isolation features 104. Various field effect transistors are formed on the fin active regions 106. In some embodiments, PFETs are disposed on the fin active regions 106 within the first region 102A and NFETs are disposed on the fin active regions 106 within the second region 102B. In some embodiments, FETs have a vertically stacked channel structure, such as gate-all-around FET structure or other multi-channel structure, such as nanowire or nanosheet structure.

In some embodiments, the STI features 104 are formed by a procedure that includes patterning the semiconductor substrate 102 to form trenches; filling the trenches with one or more dielectric material; and performing a chemical mechanical polishing (CMP) process to remove the excessive dielectric material and planarize the top surface. Suitable fill dielectric materials include semiconductor oxides, semiconductor nitrides, semiconductor oxynitrides, fluorinated silica glass (FSG), low-K dielectric materials, and/or combinations thereof. In various embodiments, the dielectric material is deposited using a high-density plasma CVD (HDP-CVD) process, a sub-atmospheric CVD (SACVD) process, a high-aspect ratio process (HARP), a flowable CVD (FCVD), and/or a spin-on process.

Still referring to FIGS. 1 and 2A, the method 20 includes an operation 24 by forming various dummy gates 110 on the fin active regions 106 and the STI features 104. In the present embodiment, the dummy gates 110 have elongated shapes and are oriented in the Y direction while the fin active regions 106 are oriented in the X direction. Each of the dummy gates 110 may be disposed over multiple fin active regions 106. Especially, some dummy gates 110 or portions thereof are formed on the fin active regions 106 and some dummy gates 110 or portions thereof are formed on the STI feature 104. In some embodiments, one or more dummy gate is disposed on ends of the fin active regions 106 so that this gate is partially landing on the fin active region 106 and partially landing on the STI feature 104. Those edges are configured to reduce edge effect and improve overall device performance.

In the present embodiment, the dummy gates 110 each may include poly silicon and may additionally include silicon oxide underlying the polysilicon. The formation of the dummy gates 110 includes depositing the gate materials (including poly silicon in the present example); and patterning the gate materials by a lithographic patterning and etching. A gate hard mask may be formed on the gate materials and is used as an etch mask during the formation of the dummy gates 110. The gate hard mask may include any suitable material with etching selectivity, such as silicon oxide, silicon nitride, silicon carbide, silicon oxynitride, other suitable materials, and/or combinations thereof. In some embodiments, the patterning process to form the dummy gates 110 includes forming a patterned resist layer on the gate hard mask by lithography process; etching the gate hard mask using the patterned resist layer as an etch mask; and etching the gate materials to form the dummy gates 110 using the patterned gate hard mask as an etch mask.

One or more gate sidewall features (or spacers) 112 are formed on the sidewalls of the dummy gates 110 and the sidewalls of the fin active regions 106 as well. The spacers 112 may be used to offset the subsequently formed source/drain features and may be used for constraining or modifying the source/drain structure profile. The spacers 112 may include any suitable dielectric material, such as a semiconductor oxide, a semiconductor nitride, a semiconductor carbide, a semiconductor oxynitride, other suitable dielectric materials, and/or combinations thereof. The spacers 112 may have multiple films, such as two films (a silicon oxide film and a silicon nitride film) or three films (a silicon oxide film; a silicon nitride film; and a silicon oxide film). The formation of the spacers 112 includes deposition and anisotropic etching, such as dry etching. The dummy gates 110 are configured in the fin active regions 106 for various field effect transistors, therefore the corresponding FETs are also referred to as FinFETs. In the present examples, the field effect transistors include p-type FETs within the first region 102A and n-type FETs within the second region 102B. In other examples, those field effect transistors are configured to form a logic circuit, a memory circuit (such as one or more static random-access memory (SRAM) cells) or other suitable circuit.

Still referring to FIGS. 1 and 2A, the method 20 proceeds to an operation 26 by forming various sources and drains (or source/drain features-S/D features) 108 to respective FinFETs. The sources and drains 108 may include both light doped drain (LDD) features and heavily doped source and drain (S/D). Each field effect transistor includes a source and a drain formed on the respective fin active region and interposed by the dummy gates 110. A channel is formed in the fin active region in a portion that is underlying the dummy gate and spans between the source and drain 108.

The raised sources and drains 108 may be formed by selective epitaxial growth for strain effect with enhanced carrier mobility and device performance. The dummy gates 110 and the spacers 112 constrain the sources and drains 108 to be selectively grown within the source/drain regions with proper profile. In some embodiments, the sources and drains 108 are formed by one or more epitaxial (epi) processes, whereby Si features, SiGe features, SiC features, and/or other suitable features are grown in a crystalline state on the fin active regions 106. Alternatively, an etching process is applied to recess the source/drain regions before the epitaxial growth. Suitable epitaxial processes include CVD deposition techniques (e.g., vapor-phase epitaxy (VPE) and/or ultra-high vacuum CVD (UHV-CVD), molecular beam epitaxy, and/or other suitable processes. The epitaxial process may use gaseous and/or liquid precursors, which interact with the composition of the fin structure 106. In some embodiments, adjacent sources/drains may be grown to merge together to provide increased contact area and reduce the contact resistance. This can be achieved by controlling the epitaxial growth process.

The sources and drains 108 may be in-situ doped during the epitaxial process by introducing doping species including: p-type dopants, such as boron or $BF_2$; n-type dopants, such as phosphorus or arsenic; and/or other suitable dopants including combinations thereof. If the sources and drains 108 are not in-situ doped, an implantation process is performed to introduce the corresponding dopant into the sources and drains 108. In an embodiment, the sources and drains 108 in an nFET include SiC or Si doped with phosphorous, while those in a pFET include Ge or SiGe doped with boron. In some other embodiments, the raised sources and drains 108 include more than one semiconductor material layers. For example, a silicon germanium layer is epitaxially grown on the substrate within the source/drain regions and a silicon layer is epitaxially grown on the silicon germanium layer. One or more annealing processes may be performed thereafter to activate the sources and drains 108. Suitable annealing processes include rapid thermal annealing (RTA), laser annealing processes, other suitable annealing technique or a combination thereof.

Figure 2B:
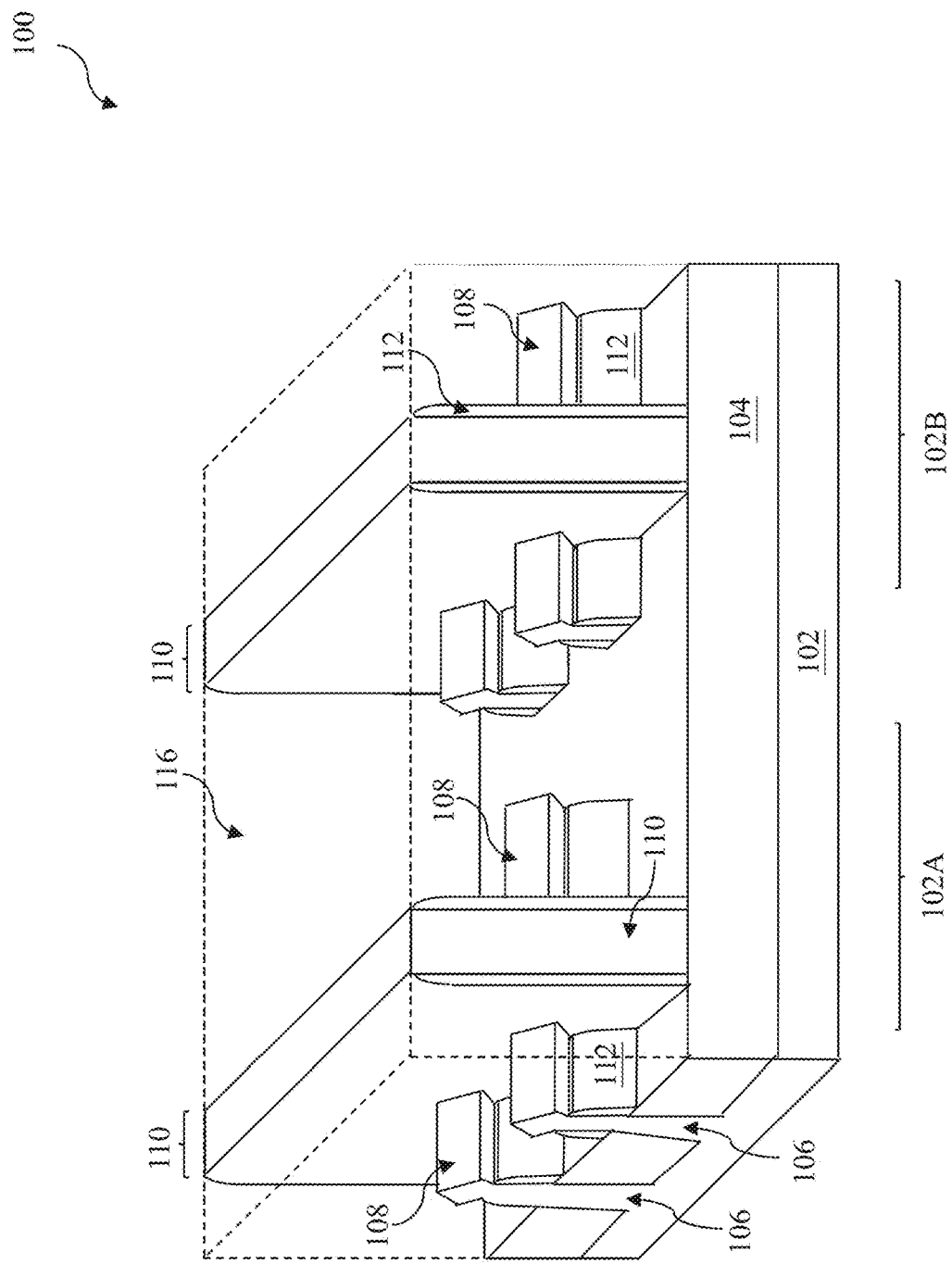

Referring to FIGS. 1 and 2B, the method 20 proceeds to an operation 28, in which an ILD layer 116 is formed on the semiconductor substrate 102, covering the sources and drains 108. The ILD layer 116 is drawn with dashed lines in FIG. 2B and is illustrated as transparent to have better view of other features (such as the fin active regions 106, the dummy gates 110, and the sources and drains 108) embedded in the ILD layer 116. The ILD layer 116 surrounds the dummy gates 110 allowing the dummy gates 110 to be removed and a replacement gate to be formed in the resulting cavity (also referred to as gate trench). Accordingly, in such embodiments, the dummy gates 110 are removed after the formation of the ILD layer 116. The ILD layer 116 is also a part of an electrical interconnect structure that electrically interconnects various devices of the semiconductor structure 100. In such embodiments, the ILD layer 116 acts as an insulator that supports and isolates the conductive traces. The ILD layer 116 may include any suitable dielectric material, such as a semiconductor oxide, a semiconductor nitride, a semiconductor oxynitride, other suitable dielectric materials, or combinations thereof. In some embodiments, the ILD layer 116 includes a low-k dielectric material (with a dielectric constant less than that of silicon oxide). The formation of the ILD layer 116 may include deposition and CMP to provide a planarized top surface.

Figure 2C:
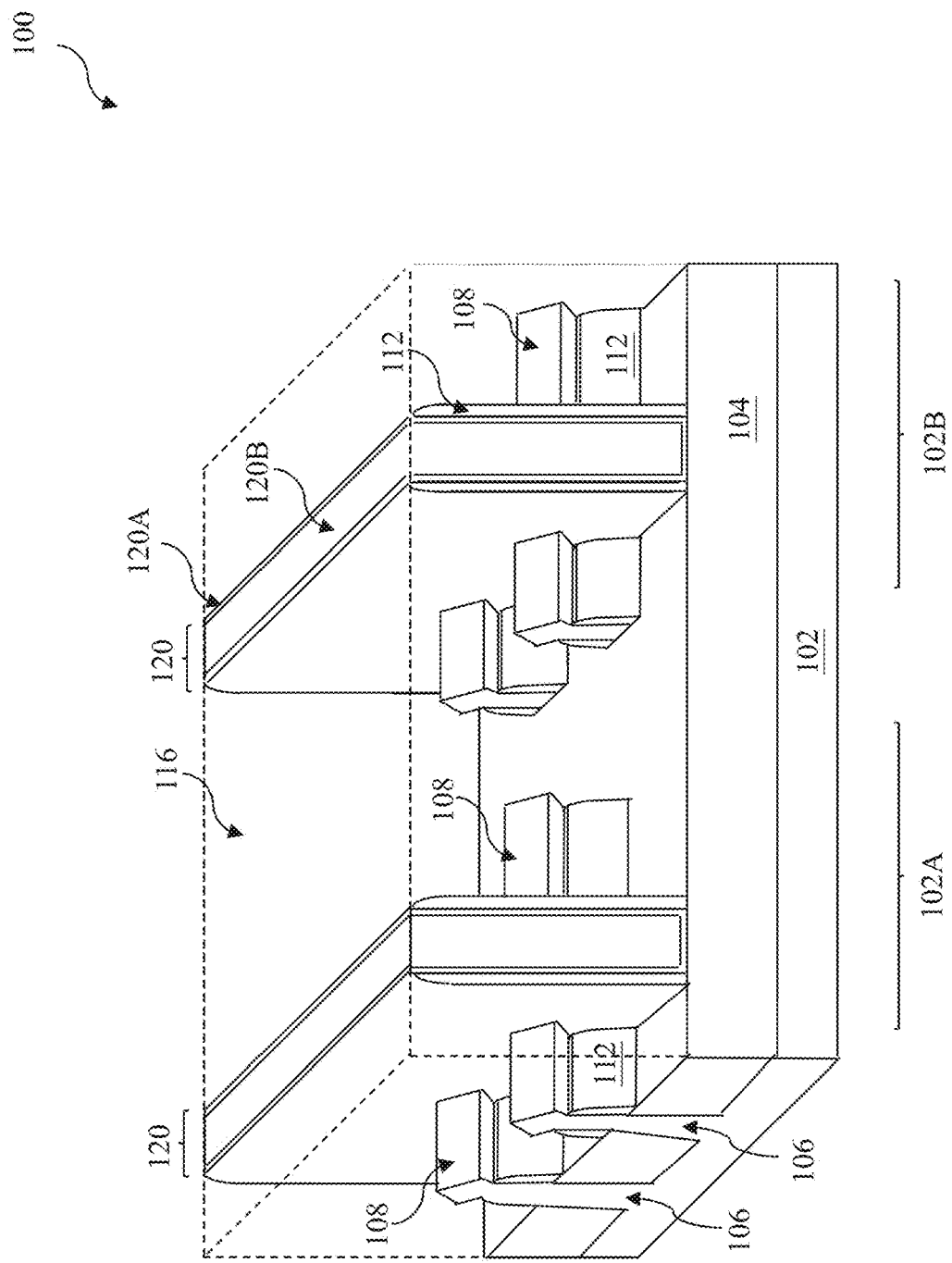

Referring to FIGS. 1 and 2C in a perspective view, the method 20 proceeds to operations for gate replacement, in which the dummy gates 110 are removed and replaced by gate stacks 120 with high-k dielectric material and metal, therefore also referred to as high-k metal gate stacks 120. In present embodiment, the gate replacement process may include an operation 30 for etching to remove the dummy gates 110, resulting in gate trenches in the ILD layer 116; an operation 32 for depositing the gate materials (such as high-K dielectric material, work function metal and filling metal) and an operation 34 for polishing by CMP. In the present embodiment, the dummy gates 110 are selectively removed by etching, resulting in gate trenches. Then the gate materials, such as high k dielectric material and metal, are deposited in the gate trenches to form the high-k metal gate stacks 120. A CMP process is further implemented to polish and remove the excessive gate materials from the semiconductor structure 100.

The gate stacks 120 are formed in the gate trenches by a proper procedure, such as a gate-last process or a high-k-last process. Although it is understood that the gate stacks 120 may have any suitable gate structure and may be formed by any suitable procedure. A gate stack 120 is formed on the semiconductor substrate 102 overlying the channel of the fin active region 106. The gate stacks 120 include a gate dielectric layer 120A and a gate electrode 120B disposed on the gate dielectric layer 120A. In the present embodiment, the gate dielectric layer 120A includes a high-k dielectric material and the gate electrode 120B includes metal or metal alloy. In some examples, the gate dielectric layer 120A and the gate electrode 120B each may include a number of sub-layers.

The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The gate dielectric layer 120A may further include an interfacial layer sandwiched between the high-k dielectric material layer and the corresponding fin active region 106. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques. In some other embodiments, the gate dielectric layer 120A is formed in the high-k last process, in which the gate dielectric layer 120A is deposited in the gate trench at the operation 32. In this case, the gate dielectric layer 120A is U-shaped.

The gate electrode may include Ti, Ag, Al, TiAlN, TaC, TaCN, TaSiN, Mn, Zr, TiN, TaN, Ru, Mo, Al, WN, Cu, W, Ru, Co, or any suitable conductive materials. In some embodiments, different metal materials are used for nFET and pFET devices with respective work functions to enhance device performance.

The gate electrode 120B may include multiple conductive materials. In some embodiments, the gate electrode 120B includes a capping layer, a work function metal layer and a filling metal layer. In furtherance of the embodiments, the capping layer includes titanium nitride, tantalum nitride, or other suitable material, formed by a proper deposition technique such as ALD. The work functional metal layer includes a conductive layer of metal or metal alloy with proper work function such that the corresponding FET is enhanced for its device performance. The work function (WF) metal layer is different in composition for a pFET and a nFET, respectively referred to as an p-type WF metal and a n-type WF metal. Particularly, an n-type WF metal is a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The work function metal is deposited by a suitable technique, such as PVD. The n-type WF metal or the p-type WF metal may include various metal-based films as a stack for optimized device performance and processing compatibility. In various embodiments, the filling metal layer includes tungsten, copper or other suitable metal. The filling metal layer is deposited by a suitable technique, such as PVD or plating.

Figure 2D:
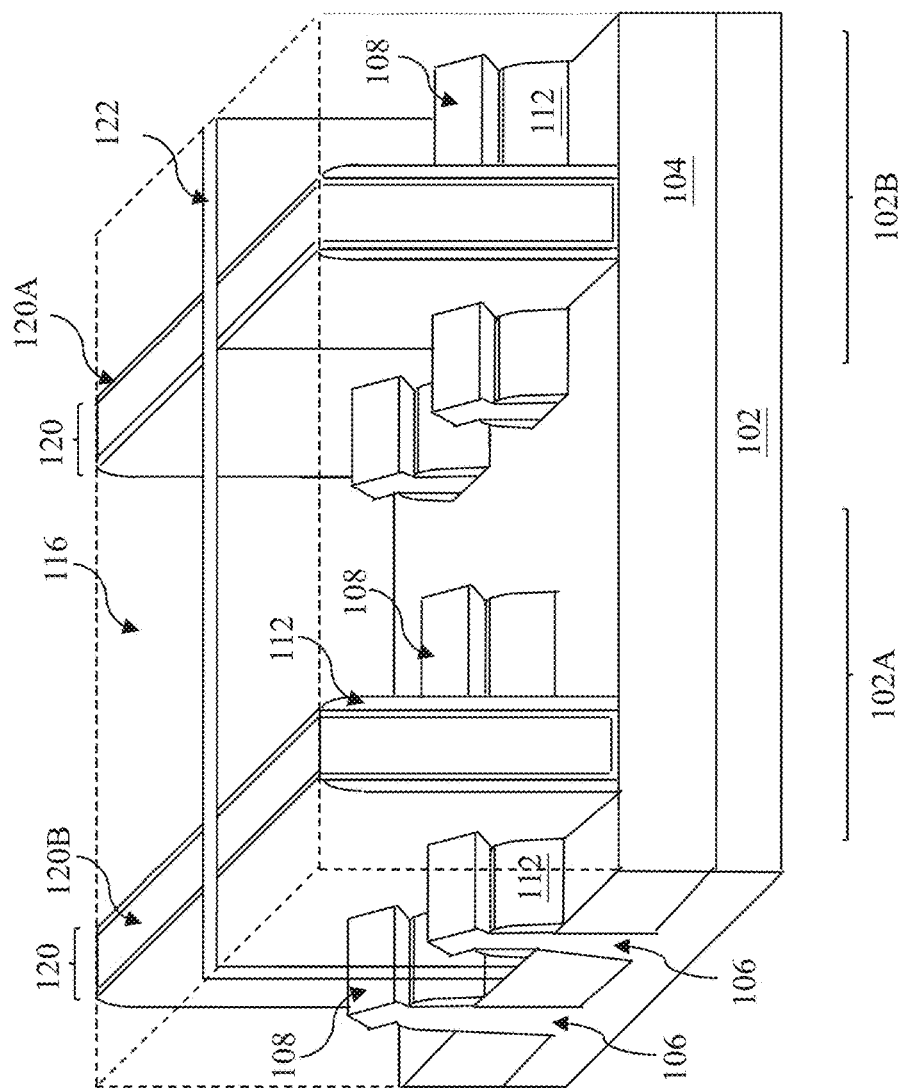

Referring to FIGS. 1 and 2D, the method 20 proceeds to an operation 36 by forming cut-metal gate (CMG or gate-cut features) 122. The gate-cut features 122 are dielectric features that separate long gate stacks 120 into short gate stacks. This is used to form gate stacks 120 in double patterning or multiple patterning process to enhance patterning resolution and reduce line-end roughness. In this case, a long gate stack is formed in a first patterning process and then is cut into short gates in a second patterning process such that the gate ends have better shape and desired dimensions. In the present embodiment, the gate-cut features 122 are formed by patterning process to form trenches and deposition to fill in the trenches with one or more dielectric material. The patterning process includes lithography process and etching process and may use hard mask to define the regions for the cut-metal gate features. The etching process may include wet etch, dry etch, or a combination thereof to etch through the conductive materials of the metal gate stacks 120. The etching process may use one or more etchant.

Still referring to FIGS. 1 and 2D, the method 20 proceeds to an operation 38 by performing a CMP process to the gate-cut features 122 to remove the excessive materials of the gate-cut features 122 deposited on the ILD layer 116 and the metal gate stacks 120, and planarize the top surface of the semiconductor device structure 100. By the operation 36 to form the gate-cut features 122 after the formation of the metal gate stacks 120, the final gate heights of the metal gate stacks 120 are more sensitive to the CMP process at the operation 38 because it is directly applied to the metal gate stacks 120. Therefore, the method 20 provides more leverage to tune gate height. The method 20 may further include other fabrication operations before, during and after the operations described above. For examples, the method includes various operations to form interconnect structure to couple various devices, including FETs, into a functional circuit.

As noted above, the gate height is a sensitive factor contributing to the effective capacitance and RC delay. In the disclosed method 20, the cut-gate process is applied to the metal gate stacks 120 instead of the dummy gate stacks 110. In this case, there are two CMP processes after the metal gate stacks 120: first CMP process at operation 34 and second CMP process at operation 38. Both CMP processes are relevant to the gate height since both are applied to the metal gate stacks 120, which provides more freedom to tune gate height according to the circuit performance, especially the circuit timing. In each CMP process, the disclosed method 20 further includes multiple measures to tune the gate height, especially, by tuning dummy region design 40 and tuning CMP slurry 42. The method 20 is further described with reference to various figures according to some embodiments.

The semiconductor structure 100 includes some active device regions and some dummy regions. An active device region refers to a region having functional FETs and corresponding metal gate stacks 120 formed therein. A dummy region refers to a region having metal gate stacks 120 disposed thereon for fabrication consideration but not configured to function as gates to FETs. For example, those metal gate stacks may be formed on the STI features and may be additionally or alternatively not electrically connected to the circuit, so not functioning as gates to FETs. In contrast, the metal gate stacks 120 disposed in the active device regions are electrically connected and functional to the corresponding FETs. In the present embodiment, an active device region is surrounded by a dummy region. In the disclosed method 20, the metal gate stacks 120 formed in the dummy regions can be designed with different densities, different dimensions, different materials (such as different work function metals) or a combination thereof to tune local CMP polish rate relative to the metal gate stacks in the active device regions. Because the metal gate stacks in the dummy regions are non-functional gates, this provide more room to tune these parameters for fabrication consideration instead of the transistor consideration. Accordingly, the method includes an operation 44 by tuning pattern densities of the metal gate stacks in the dummy regions; an operation 46 by tuning dimensions of the metal gate stacks in the dummy regions; an operation 48 by tuning gate materials (compositions) and duty ratio of the metal gate stacks in the dummy regions; and an operation 50 by tuning materials (compositions) and dimensions of the gate-cut features in the dummy regions. More particularly, the metal gate stacks 120 in the dummy regions and the gate-cut features may use different materials or have different volume percentages of each gate materials or gate-cut materials. Those gate materials (or gate-cut materials) have different polish rates, such as tungsten and titanium nitride have different hardness and therefore different polish rates. Accordingly, overall polish rate to those metal gate stacks 120 in the dummy regions or to the gate-cut features would be different from that of the metal gate stacks 120 in the active device regions. For examples, assume the circuit has n different devices with different threshold voltages, in which n may be 2, 3, 4, 5, 6, or other integer, the work function metals used in the metal gate stacks 120 may have n scenarios of work function metals in the dummy regions to tune respective gate heights accordingly.

As to tuning the CMP slurry, the first CMP process at operation 34 and the second CMP process at operation 38 experience different polish surfaces. Accordingly, the method 20 includes an operation 42 to tune the CMP slurry accordingly to the polish surface for each CMP process. Especially, the method 20 includes an operation 52 to tune the CMP abrasive (abrasive nanoparticles) of the CMP slurry according to the polish surface; and an operation 54 to tune the chemicals of the CMP slurry according to the polish surface. For examples associated with the operation 52, the abrasive nanoparticles, such as zirconium oxide (ZrO) or zirconium nitride (ZrN), are negatively charged and repel tungsten, causing the polish rate to tungsten lower. In the opposite examples, the abrasive nanoparticles are positively charged and attract tungsten, causing the polish rate to tungsten higher. By choosing charge type of the abrasive nanoparticles, the polish rates to different materials are differentiated and accordingly can be tuned differently among the dummy regions and the active device regions. In other examples associated with the operation 54, the CMP slurry can be chosen differently to enhance the polish rate of the dielectric materials or alternatively enhance the polish rate of the metal materials, such as a slurry utilizing a chemical for removing dielectric material or metal. When the metal gate stacks 120 in the dummy regions are designed with different duty ratio of the metals and dielectric materials (such as by gate pattern density and gate dimensions), the gate heights in different regions can be tuned accordingly.

The method 20 is effective to tune gate height according to the circuit of the semiconductor device structure 100, especially for the circuits having multiple threshold voltages. The method 20 is further described below with different embodiments.

Figure 3A:
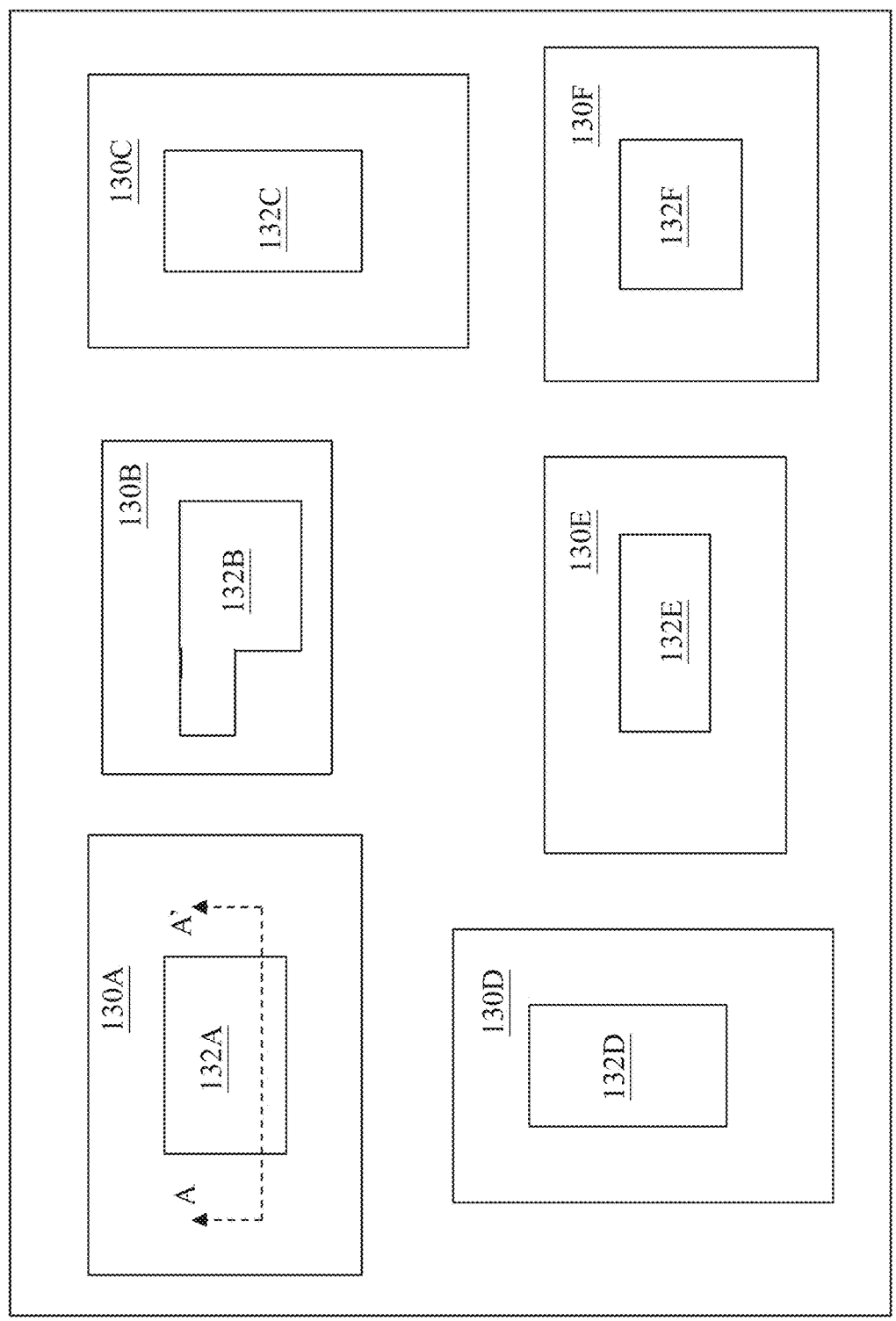
FIG. 3A is a top view of a semiconductor structure in accordance with some embodiments.

FIG. 3A is a top view of a semiconductor device structure 100 to illustrate circuit layout according to some embodiments. The semiconductor device structure 100 includes dummy regions 130 (such as 130A-130F) and active device regions 132 (such as 132A-132F) surrounded by the dummy regions 130, respectively. In some embodiments, the circuits in different active device regions 132 may have devices (such as FETs) designed with different threshold voltages, therefore different device structures, such as different thicknesses of the gate dielectric layer. In some examples, those active device regions 132A-132F each may have respective circuit with FETs with a respective threshold voltage different from those in other circuits. In some embodiments wherein one circuit or a subset of circuits of the semiconductor device structure 100 is expected to have greater heights of the gate stacks 120 in the corresponding FETs, the gate stacks 120 in the dummy region surrounding the active device region are designed to have a greater metal volume ratio than that of the gate stacks 120 in the active device region; and the CMP slurry is designed to have positively charged particles, thus the gate stacks 120 in the dummy region will be polished with a greater polish rate than that of the gate stacks 120 in the active device region, resulting in the gate stacks 120 in the active device region with a greater height. In some embodiments wherein one circuit or a subset of circuits of the semiconductor device structure 100 is expected to have greater heights of the gate stacks 120 in the corresponding FETs, the gate stacks 120 in the dummy region surrounding the active device region are designed to have a greater dielectric volume ratio than that of the gate stacks 120 in the active device region; and the CMP slurry is designed to have negatively charged particles, thus the gate stacks 120 in the dummy region will be polished with a greater polish rate than that of the gate stacks 120 in the active device region, resulting in the gate stacks 120 in the active device region with a greater height.

In some embodiments wherein one circuit or a subset of circuits of the semiconductor device structure 100 is expected to have less heights of the gate stacks 120 in the corresponding FETs, the gate stacks 120 in the dummy region surrounding the active device region are designed to have a greater dielectric volume ratio than that of the gate stacks 120 in the active device region; and the CMP slurry is designed to have positively charged particles, thus the gate stacks 120 in the active device region will be polished with a greater polish rate than that of the gate stacks 120 in the dummy region, resulting in the gate stacks 120 in the active device region with a less height. In some embodiments wherein one circuit or a subset of circuits of the semiconductor device structure 100 is expected to have less heights of the gate stacks 120 in the corresponding FETs, the gate stacks 120 in the dummy region surrounding the active device region are designed to have a greater metal volume ratio than that of the gate stacks 120 in the active device region; and the CMP slurry is designed to have negatively charged particles, thus the gate stacks 120 in the active device region will be polished with a greater polish rate than that of the gate stacks 120 in the dummy region, resulting in the gate stacks 120 in the active device region with a less height. The gate-cut features 122 can be designed similarly for its compositions to either increase or decrease the gate height in the active device region.

FIG. 3B is a top view of a semiconductor device structure 100 in portion to illustrate circuit layout, shape and size according to various embodiments. The semiconductor device structure 100 includes dummy regions 130 and active device regions 132 surrounded by the dummy region 130. The gate stacks 120 are formed on both the dummy region 130 and the active device region 132. The gate stacks 120 in the dummy region 130 are used to tune the gate height of the gate stacks in the active device region 132. However, the gate stacks in the active device region 132 are not evenly impacted by the gate stacks 120 in the dummy region 130 during a CMP process. Particularly, a subset of the gate stacks in the active device region 132 are strongly impacted during a CMP process when those are closer to the gate stacks 120 in the dummy region 130. A subset of gate stacks in the active device region 132 is weakly impacted during a CMP process when those are far away from the gate stacks 120 in the dummy region 130. Accordingly, the shape and size of dummy region 130, and the pattern density and dimensions (or collectively duty ratio) of the gate stacks 120 in the dummy region 130 are designed to provide uniform impact to the gate stacks 120 in the active device region 132. Various scenarios in FIG. 3B are constructed according to various embodiments.

In a first embodiment (A), the gate stacks 120 are not shown for the sake of simplicity. The active device region 132 is a rectangle. Since the corner areas (circled in dashed line) receive impact in both sides from the dummy region 130, therefore the impact is stronger and accordingly the dummy region 130 is shrunken back at corners to have a substantial rectangle shape but with round corners such that the impact to the active device region 132 from the dummy region 130 is uniform throughout the active device region 132.

In a second embodiment (B), the active device region 132 has an irregular geometry, such as L-shaped. Since the tip area (circled in dashed line) is narrower and receives more impact in three edges from the dummy region 130, therefore the dummy region 130 is shrunken back to have a less dimension. Particularly, the dummy region 130 has a dimension D1 at the tip area less than a dimension D2 at other regions. In some embodiments, the ratio D2/D1 ranges between 1.4 and 2.

In a third embodiment (C), the active device region 132 has a rectangle shape. The dummy region 130 has a shape similar to the shape in scenario (A) for the same reason. The gate stacks 120 in the dummy region 130 has uniform pattern density and gate dimensions (such as gate width). Collectively, the gate stacks 120 has a uniform duty ratio in the dummy region 130. The duty ratio of the gate stacks 120 is defined Sg/S, wherein S is an area concerned (such as the dummy region 130) and Sg is occupied areas by the gate stacks 120 in the area. because the dummy region 130 is shaped and sized to provide uniform impact to the gate stacks 120 (not shown) in the active device region 132, the gate stacks 120 in the dummy region 130 can have uniform pattern density and gate dimensions while maintaining the uniform impact to the gate stacks 120 in the active device region 132 by the gate stacks 120 in the dummy region 130.

In a fourth embodiment (D), the active device region 132 is T-shaped. Since the tip area (circled in dashed line) is narrower and receives impact in three edges from the dummy region 130 compared to the main area (rectangle portion on the right in the active device region 132), therefore the impact to the active device 132 from dummy region 130 is nonuniform. shrunken back at corners to have a substantial rectangle shape but with round corners. Instead of tuning the shape and size of the dummy region 130, the gate stacks 120 are tuned with different pattern density (or gate-to-gate pitch) and gate dimensions to achieve uniform gate height of the gate stacks 120 (not shown) in the active device region 132. Particularly, the gate stacks 120 include two groups: the gate stacks 120AA associated with the tip area and the gate stacks 120BB associated with the main area. The gate stacks 120AA have a first pitch $P_A$ and a first width $W_A$, and the gate stacks 120BB have a second pitch $P_B$ and a second width $W_B$ less than the first pitch $P_A$ and the first width $W_A$, respectively. For example, the ratio $W_A/W_B$ ranges between 1.2 and 1.8, and the ratio $P_A/P_B$ ranges between 1.2 and 1.8, By constructing the gate stacks 120AA and 120BB with respective gate pitches and gate widths, the gate height of the gate stacks 120 in the active device region 132 can be uniformly tuned during the CMP process.

In a second embodiment (E), the active device region 132 has an irregular geometry, such as L-shaped. Since the tip area (circled in dashed line) is narrower and receives more impact in three edges from the dummy region 130, the shape and size of the dummy region 130 and the gate pitch and gate width of the gate stacks 120 in the dummy region 130 are collectively tuned to achieve uniform gate height of the gate stacks 120 in the active device region 132. the shape and size of the dummy region 130 are tuned in a way similar to those in the scenario (B) and the gate pitch and gate width of the gate stacks 120 in the dummy region 130 are tuned in a way similar to those in the scenario (D).

FIGS. 4A-4D are side sectional view of the semiconductor device structure 100, may be taken along the dashed line AA' of FIG. 3, at various stages during a fabrication process in accordance with some embodiments. The method 20 and the semiconductor device structure 100 are collectively described with reference to FIGS. 3 and 4A-4D with more details on the two CMP processes during the operations 34 and 38.

Referring to FIG. 4A, the semiconductor device structure 100 may include active device regions ("A") and dummy regions ("D"). The semiconductor device structure 100 includes a semiconductor substrate 102 with various devices (such as FETs), isolation features, doped wells, or a combination thereof formed thereon. For example, the semiconductor substrate 102 may include various S/D features, isolation structures, fin other suitable layers, or combinations thereof. In some embodiments, one or more dummy polysilicon gates 110 may be formed on the semiconductor substrate 102, such as formed on the fin active regions 106. In some embodiments, the dummy polysilicon gates 110 may be formed by depositing a polysilicon material on the semiconductor substrate 102 followed by patterning and etching the polysilicon material to form the gates 110. After the gates 110 are formed, gate spacers 112 are formed on the sidewalls of the gates 110 by deposition and anisotropic etch. The semiconductor device structure 100 further includes the ILD layer 116 formed by deposition and a CMP process or other suitable technique. The metal gate stacks 120 are formed by a gate replacement process including various operations.

Referring to FIG. 4B, the metal gate stacks 120 are remove by the operation 30 that includes etch, resulting in gate trenches 142 in the ILD layer 116.

Referring to FIG. 4C, the metal gate stacks 120 are formed in the gate trenches 142 by the operation 32 that includes depositing various gate materials, such as high-k dielectric material, one or more liners or capping layers, work function metal and filling metal. The gate materials not only deposited in the gate trenches 142 and may also deposited on the ILD layer 116.

Still referring to FIG. 4C, the CMP process at the operation 34 is applied to remove the excessive the gate materials on the ILD layer 116 and planarize the top surface of the semiconductor device structure 100 as well. In the present embodiment, the metal gate stacks 120 in the dummy region D includes a high ratio of tungsten (W) in accordance with some embodiments. In furtherance of the embodiment, the filling metal is tungsten; the work function metal includes titanium nitride (TiN), titanium aluminum nitride (TiAlN), a combination thereof; the gate dielectric layer 120A includes a silicon oxide layer and high-K dielectric material layer.

The work function metal layer 144 in the dummy regions D may include less work function metals than those of the work function metal layer 146 in the active device regions A, which means more tungsten in the metal gate stacks 120 in the dummy regions D than that in the active device regions A.

As noted above, the gate materials (such as work functional metals) for the metal gate stacks in the dummy regions are tunable for desired gate heights of the metal gate stacks 120 in the active device regions. Various material compositions of the metal gate stack 120 in the dummy regions D of FIG. 4C are provided below in accordance with some embodiments. The gate materials used in the metal gate stacks 120 in the dummy regions include silicon oxide ("SiO") as an interfacial layer; a high-k dielectric material layer ("High-K"); silicon nitride ("SiN") as a capping layer; TiN and TiAlN ("TiN" and "TiAlN") as work function metals; and tungsten as filling metal ("W"). The material compositions are presented in volume percentage (%). The total gate volume is 100%. In 3 scenarios, the metal gate stacks 120 in the dummy regions D have less volume of work function metals, and higher W volume percentages than those in the active device regions A. Particularly, in scenario 1, the gate materials include 5%~7% High-K; 0%~2% TiN; 6%~8% TiAlN; 18%~22% W; 18%~22 SiN and 44%~50% SiO. In scenario 2, the gate materials include 5%~7% High-K; 4%~6% TiN; 6%~8% TiAlN; 14%~16% W; 18%~22 SiN and 44%~50% SiO. In scenario 3, the gate materials include 5%~7% High-K; 9%~11% TiN; 6%~8% TiAlN; 9%~11% W; 18%~22 SiN and 44%~50% SiO.

The slurry of the CMP process includes negatively charged abrasive nanoparticles 148, which are repelled from tungsten, leading to more negatively charged abrasive nanoparticles 148 distributed in the active device regions A that have less tungsten ratio. Thus, during the CMP process 64, due to negatively charged abrasive nanoparticles and higher tungsten ratio in the dummy regions, the CMP polish rate in the active device regions A is greater than the polish rate in the dummy regions D. Accordingly, the gate height of the metal gate stacks 120 in the active device regions A is less, such as 1-3 nm less, than those in the dummy regions D, as illustrated in FIG. 4D. The charge type of the abrasive particles can be tuned by tuning the pH value of the corresponding slurry. For abrasive particles of a given composition, there exists is a pH value wherein the number of negative group and positive group are equal. This pH value is referred to as a point of zero charge (pzc) to abrasive particles of the given material. When the pH is at pzc, abrasive particles show zero zeta potential and balanced charges. When the pH value is different from the pzc, the abrasive particles are charged negatively or positively. For examples, $SiO_2$ shows negative charge at about pH (pzc) 3. Here pH (pzc) 3 is a relative pH value with pzc as reference. $SiO_2$ charge is slightly decreased with an increase in pH above pH 9, which is attributed to the compression of the electrical double layer. $Si_3N_4$ shows a negative above pH(pzc) 6.5 by formation of SiO.

Figure 5:
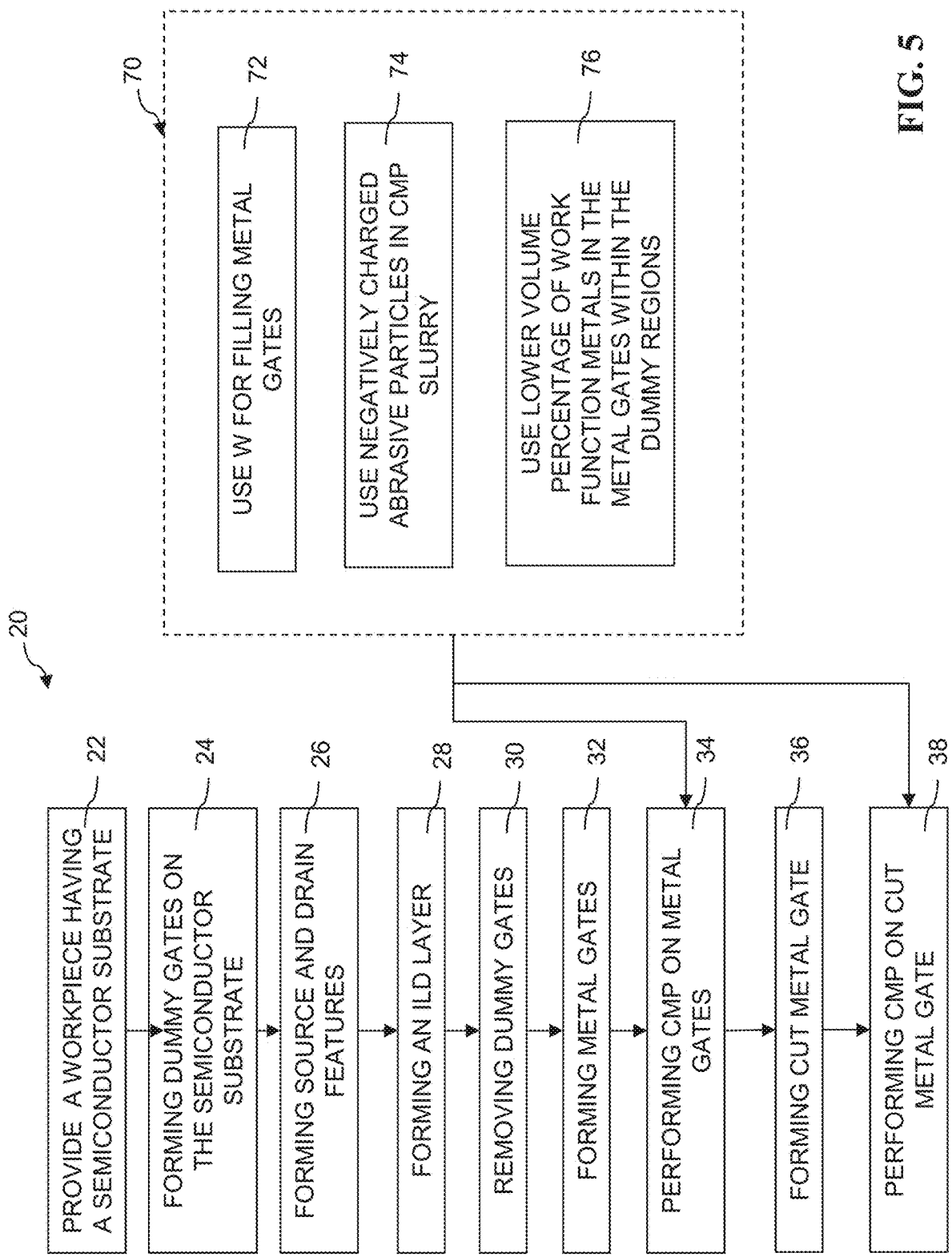
FIG. 5 is a flow chart illustrating a method of forming a semiconductor structure in accordance with some embodiments.

The same CMP process may also be implemented in the operation 38 for the CMP process after the gate-cut features are formed. This method is further summarized in the flowchart illustrated in FIG. 5. In this method 70, tungsten is used as filling metal (72); negatively charged abrasive nanoparticles 148 are used in the CMP slurry (74); and the work function metal layer 144 of the metal gate stacks 120 in the dummy regions D have lower volume percentages than that of the work function metal layer 146 in the active device regions A (76). By applying the method 70 to the CMP process at the operation 34, the CMP process at the operation 38, or both, the gate height of the metal gate stacks 120 in the active device regions A may be reduced by few nanometers than those in the dummy regions. This can reduce the effective capacitance ($C_{eff}$) in the active device regions A by about 1% or more. In some other embodiments, W, TiN, Al, TaN, TiSiN, or a combination thereof may be used as filling metal, depending on metal gates on active device regions or dummy regions, and desired gate height tuning effect.

Figure 6:
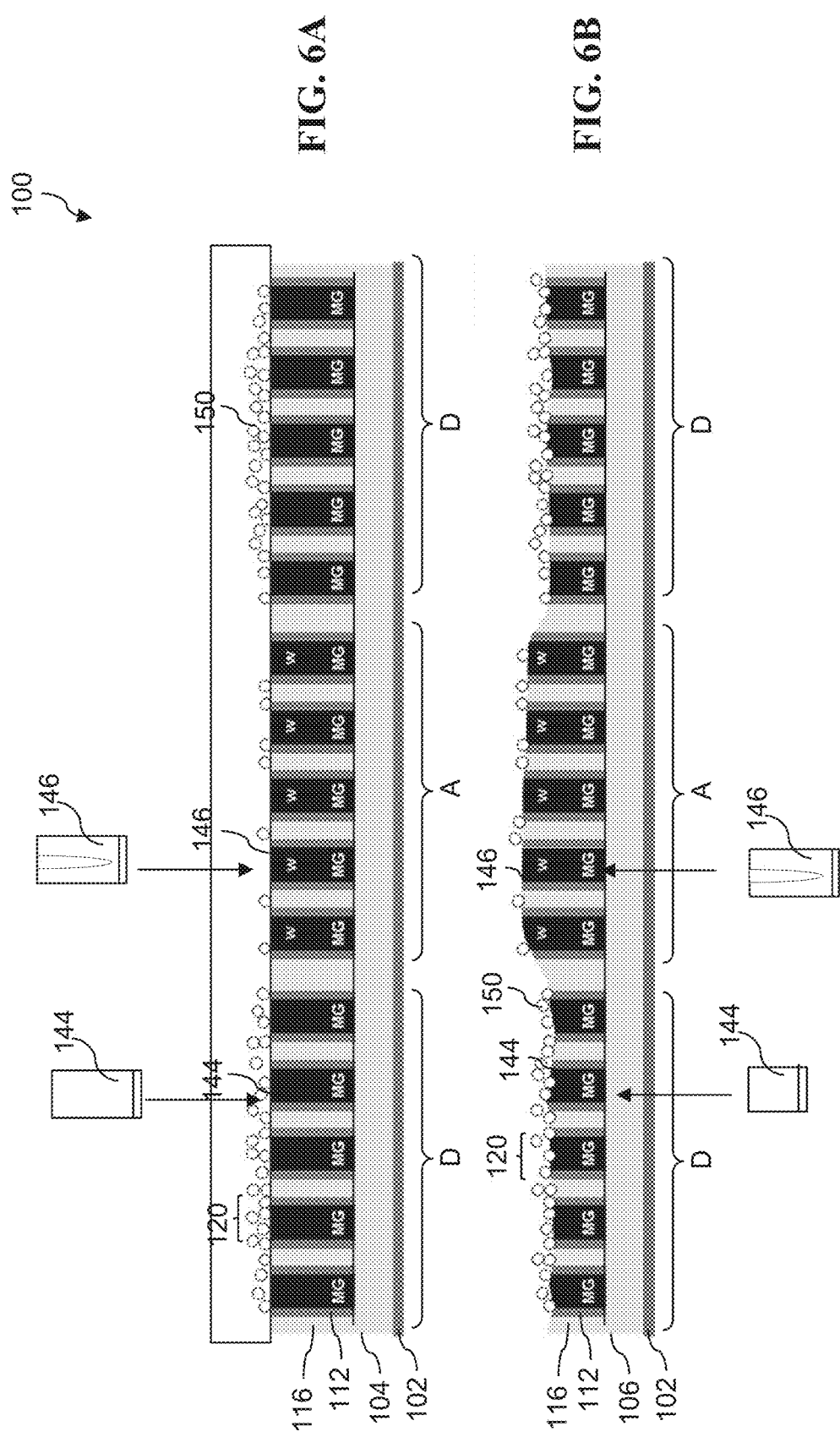
FIG. 6A is a side section view of a semiconductor structure before performing a CMP process illustrating a metal gate in a dummy region including a low ratio of tungsten in accordance with some embodiments.
FIG. 6B is a side section view of the semiconductor structure of FIG. 6A after performing the CMP process using a positively charged abrasive in accordance with some embodiments.

Another embodiment of a method 80 to tune the gate heights with different CMP processing scenarios is illustrated in FIGS. 6A-6C constructed in accordance with some embodiments. Referring to FIG. 6A, the CMP process at the operation 34 is applied to remove the excessive gate materials on the ILD layer 116 and planarize the top surface of the semiconductor device structure 100 as well. In the present embodiment, the metal gate stacks 120 in the dummy region D includes a low ratio of tungsten in accordance with some embodiments. In furtherance of the embodiment, the filling metal is tungsten; the work function metal includes TiN, TiAlN, or a combination thereof; the gate dielectric layer 120A includes a silicon oxide layer and high-K dielectric material layer.

The work function metal layer 144 in the dummy regions D include more work function metals than those of the work function metal layer 146 in the active device regions A, which means less tungsten in the metal gate stacks 120 in the dummy regions D than that in the active device regions A. Various material compositions of the metal gate stack 120 in the dummy regions D of FIG. 6A are provided below in accordance with some embodiments. The gate materials used in the metal gate stacks 120 in the dummy regions include silicon oxide ("SiO") as an interfacial layer; a high-k dielectric material layer ("High-K"); silicon nitride ("SiN") as a capping layer; TiN and TiAlN ("TiN" and "TiAlN") as work function metals; and tungsten as filling metal ("W"). The material compositions are presented in volume percentage (%). The total gate volume is 100%. In 3 scenarios, the metal gate stacks 120 in the dummy regions D have higher volume of work function metals, and higher W volume percentages than those in the active device regions A. Particularly, in scenario 1, the gate materials include 5%~7% High-K; 13%~17% TiN; 6%~8% TiAlN; 4%~6% W; 18%~22 SiN and 44%~50% SiO. In scenario 2, the gate materials include 5%~7% High-K; 16%~20% TiN; 6%~8% TiAlN; 1%~3% W; 18%~22 SiN and 44%~50% SiO. In scenario 3, the gate materials include 5%~7% High-K; 18%~22% TiN; 6%~8% TiAlN; 0%~2% W; 18%~22 SiN and 44%~50% SiO.

The slurry of the CMP process includes negatively charged abrasive nanoparticles 150, which are repelled from to tungsten, leading to more negatively charged abrasive nanoparticles 150 distributed in the dummy regions D with lower tungsten ratio. Thus, during the CMP process 34, due to negatively charged abrasive nanoparticles and lower tungsten ratio in the dummy regions, the CMP polish rate in the dummy regions D is greater than the polish rate in the active device regions A. Accordingly, the gate height of the metal gate stacks 120 in the active device regions A is greater, such as 1~3 nm greater, than those in the dummy regions D, as illustrated in FIG. 6B.

Figure 7:
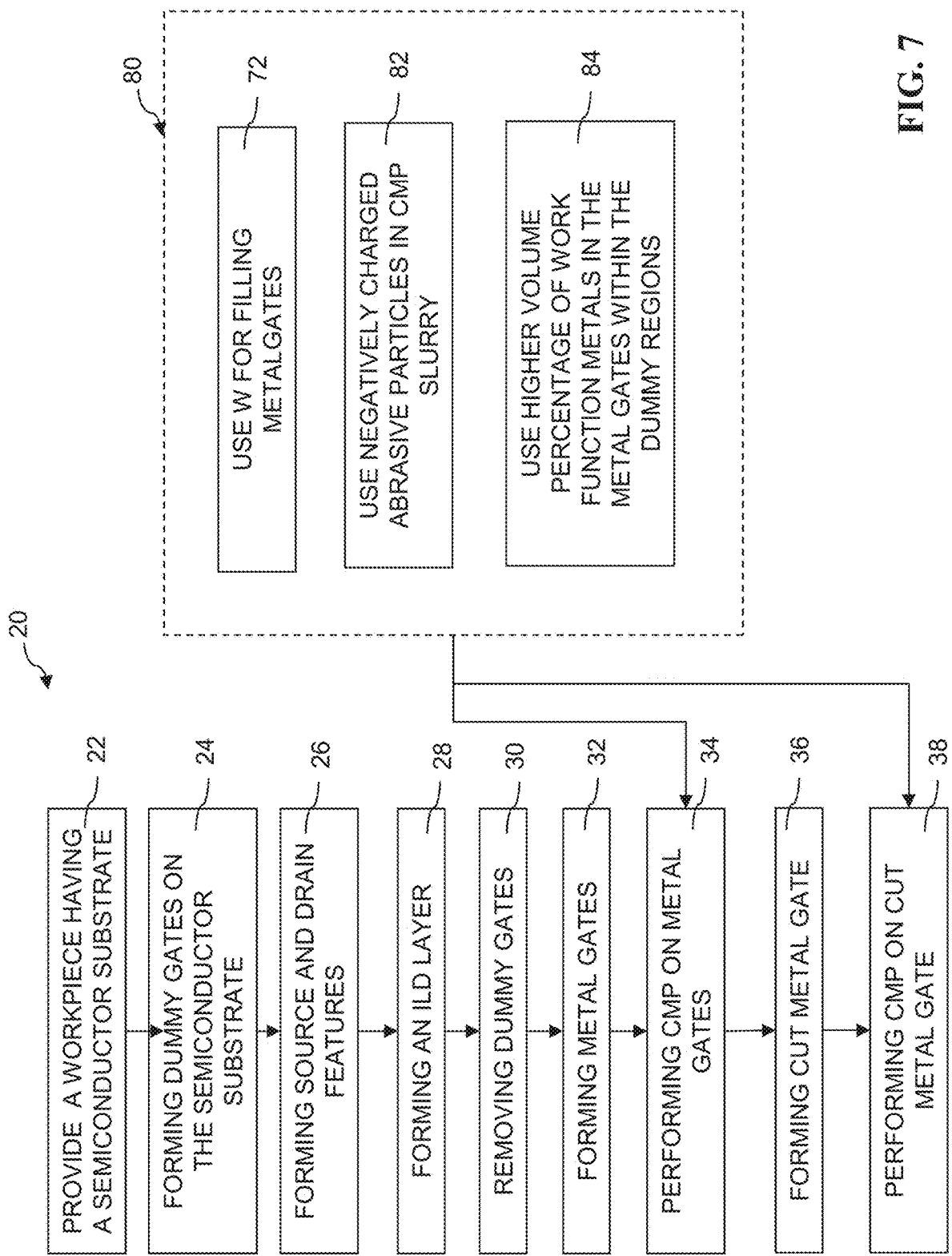
FIG. 7 is a flow chart illustrating a method of forming a semiconductor structure in accordance with some embodiments.

The same CMP process may also be implemented in the operation 38 for the CMP process after the gate-cut features are formed. This method 80 is further summarized in the flowchart illustrated in FIG. 7. In this method 80, tungsten is used as filling metal (72); positively charged abrasive nanoparticles 150 are used in the CMP slurry (82); and the work function metal layer 144 of the metal gate stacks 120 in the dummy regions D have higher volume percentages than that of the work function metal layer 146 in the active device regions A (84). By applying the method 80 to the CMP process at the operation 34, the CMP process at the operation 38, or both, the gate height of the metal gate stacks 120 in the active device regions A may be reduced by few nanometers than those in the dummy regions. This can reduce the effective capacitance ($C_{eff}$) in the active device regions A by about 1% or more.

Figure 8C:
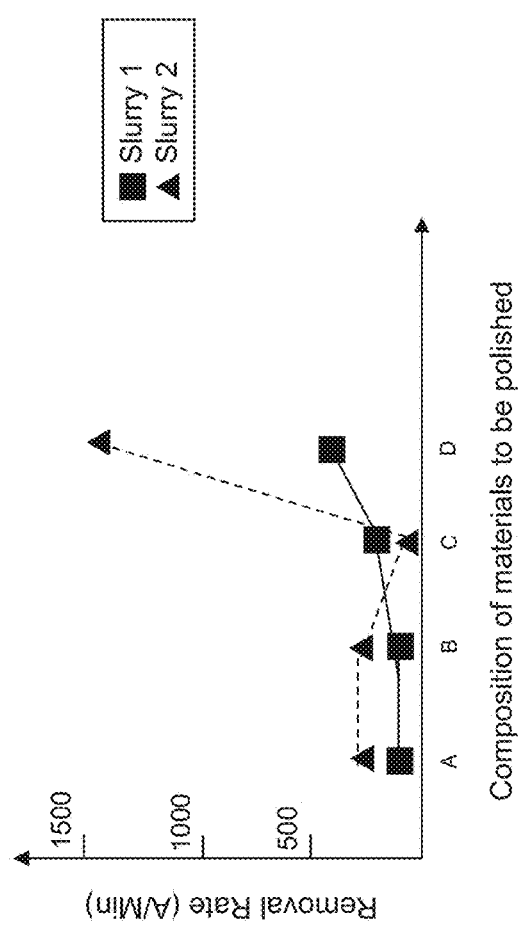
FIG. 8C is a diagram illustrating removal rates of various materials for different slurry types in accordance with some embodiments.

Another embodiment of a method 90 to tune the gate heights with different CMP processing scenarios is illustrated in FIGS. 8A-8D constructed in accordance with some embodiments. Referring to FIG. 8A, the CMP process at the operation 38 is applied to remove the excessive dielectric materials of the gate-cut features 122 deposited on the ILD layer 116 and planarize the top surface of the semiconductor device structure 100 as well. In the present embodiment, the CMP process at the operation 38 is tuned by the method 90 illustrated in FIG. 9. The method 90 includes using different compositions for the gate-cut features 122 in the dummy regions D; using different pattern density to the gate-cut features 122 in the dummy regions D; and choosing a CMP slurry according to the composition of the gate-cut features 122 in the dummy regions D. This is further explained with one example. For the operation 92, the gate-cut features 122 use two dielectric materials: silicon oxide ($SiO_2$), silicon nitride (SiN) or a combination thereof. However, the gate-cut features 122 within the dummy regions D choose the dielectric materials differently from those in the gate-cut features 122 in the active device regions A, such as the dummy regions D choosing one of $SiO_2$ and SiN, and the active device regions A choosing another, or vise verse. Alternatively, both dummy regions D and the active device regions A chose $SiO_2$ and SiN but with different volume ratio. As to the operation 94, the pattern density of the gate-cut features 122 is tuned either higher or lower. As to the operation 96, the CMP process is chosen between two type CMP slurries, one having a higher polish rate to $SiO_2$ and another having a higher polish rate to SiN. By applying three factors (92, 94 and 96), the gate height of the metal gate stacks 120 in the active device regions A can be tuned either higher or lower according to the desired gate height to fit the circuit requirement.

FIG. 8C provides a diagram illustrating polishing removal rates of two CMP slurries (Slurry 1 and Slurry 2) over various gate materials based on the experiments. The diagram is includes a vertical axis representing the polishing removal rate (angstrom per minute or A/min) and a horizontal axis representing four exemplary gate materials to be polished: A, B, C and D. According to some embodiments, A is a filling metal W; filling metal W; and B and C are two dielectric materials for the gate-cut features 122, such as SiN and $SiO_2$, respectively; and D is a work function metal TiN.

In some embodiments, each of the slurry 1 and slurry 2 includes strong oxidizing agent, such as hydrogen peroxide ($H_2O_2$) and iron nitrate ($FeNO_3$), KOH, $NH_4OH$, $HNO_3$ or a combination thereof; and abrasive nanoparticles, such as silica $SiO_2$, alumina $Al_2O_3$, $CeO_2$, $ZrO_2$, or a combination thereof. Furthermore, the abrasive particles in the slurries 1 and 2 may include negatively charged abrasive particles, such as $NH_4OH$ and silica $SiO_2$ created negative —OH group; and positively charged abrasive particles, such as cetrimonium bromide (CTAB) surfactant and silica $SiO_2$. However, the slurries 1 and 2 are respectively tuned with different compositions and concentrations to have desired polish rates to various materials. From the diagram, the experiments indicate that the slurry 1 and slurry 2 have different polishing rates to various materials to be polished. Particularly, slurries 1 and 2 show polishing effects to materials A, B and D (also referred to as first type materials) different from that to material C (also referred to as second type materials). In this example, when the slurry 1 is switched to slurry 2, the polishing removal rates to the first type materials (such as materials A, B and D) are increased while the polishing removal rates to the second type materials (such as material C) is decreased. Thus, the diagram from the corresponding experiment data provides a guideline for gate height tuning. For example, when the slurry 1 is used and the gate height of the metal gate stacks 120 in the active device regions is desired to be greater, the metal gate stacks 120 in the dummy regions are formed with more of the second type materials (especially material D due to substantial increase in the polishing removal rate) to increase the polishing removal rate to the metal gate stacks 120 in the dummy regions so that the metal gate stacks in the active device regions have a lower polishing removal rate and a relative greater height. In another example where the slurry 1 is used and the gate height of the metal gate stacks 120 in the active device regions is desired to be less, the metal gate stacks 120 in the dummy regions are formed with more of the first type materials to decrease the polishing removal rate to the gates in the dummy regions so that the metal gate stacks 120 in the active device regions have a greater polishing removal rate and a relative less height. In yet another example where the slurry 2 is used and the gate height of the metal gate stacks 120 in the active device regions is desired to be less, the metal gate stacks 120 in the dummy regions are formed with more of the second type materials to decrease the polishing removal rate to the metal gate stacks 120 in the dummy regions so that the metal gate stacks 120 in the active device regions have a greater polishing removal rate and a relative less height. In another example where the slurry 2 is used and the gate height of the metal gate stacks 120 in the active device regions is desired to be greater, the metal gate stacks 120 in the dummy regions are formed with more of the first type materials to increase the polishing removal rate to the metal gate stacks 120 in the dummy regions so that the metal gate stacks 120 in the active device regions have a less polishing removal rate and a relative greater height. In other examples, silicon nitride is usually positively charged and attracts negatively charged abrasive particles. Accordingly, the slurry 2 is designed with a higher concentration of the negatively charged abrasive particles than that of the slurry 1, and therefore has a higher polish rate to silicon nitride. Generally, the polish rate to each respective material to be polished is determined by a combination of all above slurry compositions, various compositions and concentrations of the slurries 1 and 2 can be designed to provide a polish matrix according to FIG. 8C for proper tuning gate heights.

Figure 8D:
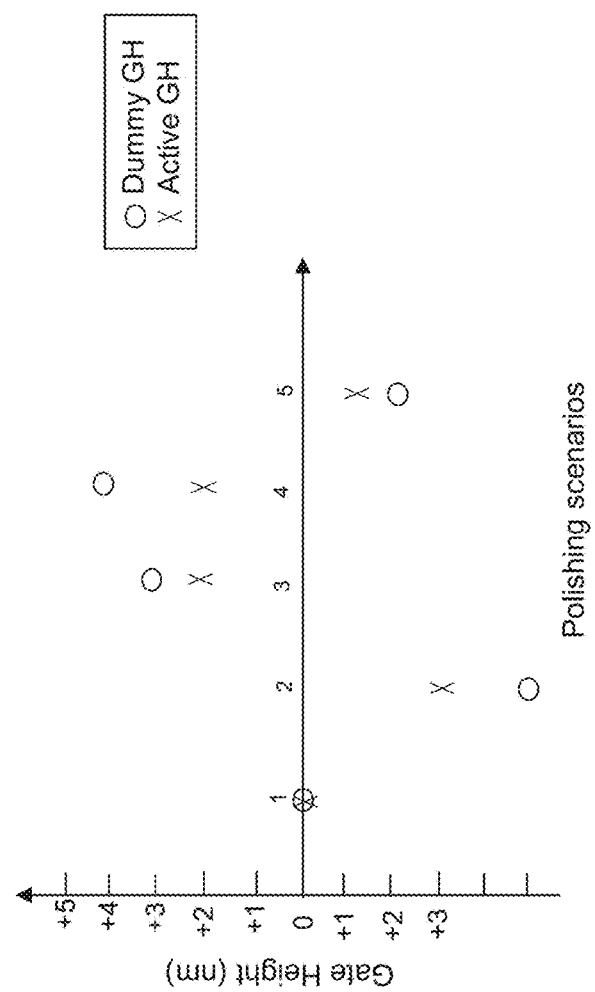
FIG. 8D is a diagram illustrating gate height in the dummy region and gate height in the active region for various combinations of CMG density, CMG fill, and slurry type in accordance with some embodiments.
Figure 9:
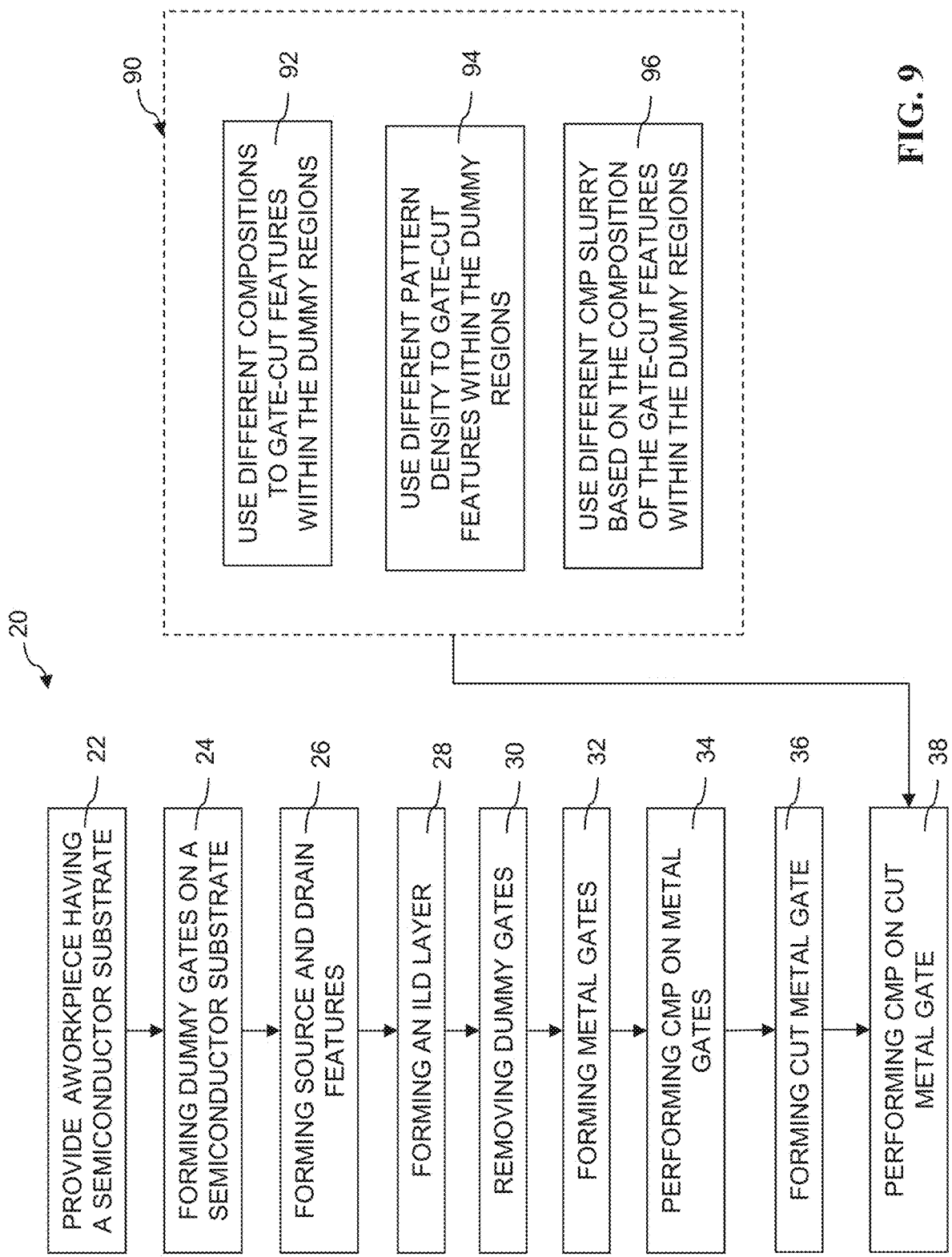
FIG. 9 is a flow chart illustrating a method of forming a semiconductor structure in accordance with some embodiments.

As described previously, the gate materials for both the gate-cut features 122 and the metal gate stacks 120 in the dummy regions have the freedom to be tuned for favorable gate heights. FIG. 8D is a diagram representing 5 scenarios 1, 2, 3, 4 and 5, each with respective density of the gate-cut features 122 ("CMG Density") in the dummy regions; compositions of the gate-cut features 122 ("CMG Fill"); and slurry ("CMG CMP Slurry"), as labeled in the horizontal axis. The scenario 1 has low CMG density, the composition of the gate-cut features 122 as either B (such as SiN) or C (such as SiO), and slurry 1 or 2; the scenario 2 has high CMG density, the composition of the gate-cut features 122 as B (such as SiN), and slurry 2; the scenario 3 has high CMG density, the composition of the gate-cut features 122 as B (such as SiN), and slurry 1; the scenario 4 has high CMG density, the composition of the gate-cut features 122 as C (such as SiO), and slurry 2; and the scenario 5 has high CMG density, the composition of the gate-cut features 122 as C (such as SiO), and slurry 1. The gate height results (decreased "−", or increased "+") in the dummy regions D ("Dummy GH") and the relative gate height results in the active device regions A ("Active GH") are respectively represented in the vertical axis. For example, in the scenario 3, the gate height of the metal gate stacks 120 in the dummy regions D is increased 3 nm and the gate height of the metal gate stacks 120 in the active device regions A is increased 2 nm. From the diagram, the scenarios 3 and 4, the gate height of the metal gate stacks 120 in the active device regions A is relatively less than the gate height of the metal gate stacks 120 in the dummy regions D, and therefore can be utilized when the gate height of the metal gate stacks 120 in the active device regions A is desired to be greater. the scenarios 2 and 5, the gate height of the metal gate stacks 120 in the active device regions A is relatively greater than the gate height of the metal gate stacks 120 in the dummy regions D, and therefore can be utilized when the gate height of the metal gate stacks 120 in the active device regions A is desired to be less.

FIG. 8B illustrates one exemplary results of the gate heights in the dummy regions D and the active device regions A associated with the scenario B after the CMP process at the operation 38.

In various embodiments, the methods 70, 80 and 90 may be combined to generate the desired gate heights among the dummy and active device regions. For example, the methods 70 and 90 are combined. Not only the abrasive nanoparticles is chosen to be negatively charged (74) and the volume percentage of the work function metal in the dummy regions D is tuned to be lower (78) but also the metal gate stacks 120 in the dummy regions D are tuned to have different composition (92), different pattern density (94) and the CMP slurry is also chosen among the two CMP slurries (96) to tune the gate height of the metal gate stacks 120 in the active device regions A. Similarly, the methods 70 and 90 may be combined to tune the gate height of the metal gate stacks 120 in the active device regions A.

The present disclosure provides a method to fabricate field-effect transistors with more freedom and approaches to tune the gate height according to the circuit design consideration, such as effective capacitance and time delay, to enhance the circuit performance. The method includes tuning the gate stacks in the dummy regions for its composition and pattern density, and further tuning the CMP slurry for its chemicals and abrasive nanoparticles including charging, geometry and dimension.

In one aspect, the present disclosure describes fabricating devices with tunable gate height and effective capacitance.

A method includes forming a first metal gate stack in a dummy region of a semiconductor substrate, the first metal gate stack including a first work function metal (WFM) layer; forming a second metal gate stack in an active device region of the semiconductor substrate, the second metal gate stack including a second WFM layer different than the first WFM layer; and performing a CMP process using a slurry including charged abrasive nanoparticles. The charged abrasive nanoparticles include a first concentration in the active device region different from a second concentration in the dummy region causing different polish rates in the active device region and dummy region. After the performing of the CMP process, the first metal gate stack has a first height different from a second height of the second metal gate stack.

In another aspect, the present disclosure provides a method that includes providing a semiconductor substrate; forming a first metal gate stack in a dummy region of the semiconductor substrate, the first metal gate stack including a first work function metal layer; forming a second metal gate stack in an active device region of the semiconductor substrate, the second metal gate stack including a second work function metal layer different than the first work function metal layer; and performing a chemical mechanical polishing (CMP) process using a slurry including a negatively charged abrasive nanoparticles, wherein the negatively charged abrasive nanoparticles includes a higher concentration in the active device region than in the dummy region causing a faster removal rate in the active device region, and wherein after the performing of the CMP process, the first metal gate stack has a first height greater than a second height of the second metal gate stack.

In yet another aspect, the present disclosure provides a method that includes providing a semiconductor substrate; forming a first metal gate stack in a dummy region of the semiconductor substrate and a first second metal gate stack in an active device region of the semiconductor substrate; forming first cut metal gates (CMGs) in the dummy region; forming second CMGs in the active device region, wherein the second CMGs are different from the first CMGs in composition; and performing a chemical mechanical polishing (CMP) process using a slurry, wherein after the performing of the CMP process, the first metal gate stack has a first height different from a second height of the second metal gate stack.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a semiconductor substrate having a dummy region and an active device region;
   forming a first metal gate stack in the dummy region and a second metal gate stack in the active device region; and
   performing a chemical mechanical polishing (CMP) process using a slurry including charged abrasive nanoparticles, wherein the charged abrasive nanoparticles include a first concentration in the active device region different from a second concentration in the dummy region causing different polish rates in the active device region and dummy region, and wherein after the performing of the CMP process, the first metal gate stack has a first height different from a second height of the second metal gate stack.

2. The method of claim 1, wherein the slurry includes a negatively charged abrasive nanoparticle, wherein the negatively charged abrasive nanoparticle includes a higher concentration in the active device region than in the dummy region, and wherein after the performing of the CMP process, the first height of the first metal gate stack is greater than the second height of the second metal gate stack.

3. The method of claim 2, wherein
each of the first and second metal gate stacks includes tungsten as a filling metal;
the first metal gate stack includes a first work function metal layer having titanium nitride with a first volume percentage; and
the second metal gate stack includes a second work function metal layer having titanium nitride with a second volume percentage greater than the first volume percentage.

4. The method of claim 2, wherein the performing of the CMP process includes polishing the active device region at a polish rate faster than the dummy region.

5. The method of claim 1, wherein the slurry includes a positively charged abrasive nanoparticle, wherein the positively charged abrasive nanoparticle includes a lower concentration in the active device region than in the dummy region, and wherein after the performing of the CMP process, the first height of the first metal gate stack is less than the second height of the second metal gate stack.

6. The method of claim 5, wherein
each of the first and second metal gate stacks includes tungsten as a filling metal;
the first metal gate stack includes a first work function metal layer having titanium nitride with a first volume percentage; and
the second metal gate stack includes a second work function metal layer having titanium nitride with a second volume percentage less than the first volume percentage.

7. The method of claim 1, wherein the abrasive nanoparticles include zirconium oxide, zirconium nitride or a combination thereof.

8. The method of claim 1, further comprising
forming a first cut metal gate (CMG) in the dummy region and a second CMG in the active device region, wherein the first and second CMGs are different in composition; and
thereafter performing another CMP process using the slurry including the charged abrasive nanoparticles.

9. The method of claim 1, further comprising tuning a pH value of the slurry to provide the charged abrasive nanoparticles.

10. A method, comprising:
forming a first metal gate stack in a dummy region of a semiconductor substrate and a second metal gate stack in an active device region of the semiconductor substrate, the first and second metal gate stacks being different in composition; and
performing a chemical mechanical polishing (CMP) process using a slurry including positively charged abrasive nanoparticles, wherein the positively charged abrasive nanoparticles includes a lower concentration in the active device region than in the dummy region, and wherein after the performing of the CMP process, the first metal gate stack has a first height less than a second height of the second metal gate stack.

11. The method of claim 10, wherein the performing of the CMP process includes polishing the active device region at a rate slower than the dummy region.

12. The method of claim 10, wherein
the first metal gate stack including a first work function metal layer;
the second metal gate stack including a second work function metal layer different than the first work function metal layer; and
the active device region is surrounded by the dummy region.

13. The method of claim 10, wherein the abrasive nanoparticles include zirconium oxide, zirconium nitride or a combination thereof.

14. The method of claim 10, further comprising
forming a first cut metal gate (CMG) in the dummy region and a second CMG in the active device region, wherein the first and second CMGs are different in at least one of composition and pattern density; and
thereafter performing another CMP process using the slurry including the positively charged abrasive nanoparticles.

15. A method, comprising:
forming a first metal gate stack in a dummy region of a semiconductor substrate and a second metal gate stack in an active device region of the semiconductor substrate;
performing a first chemical mechanical polishing (CMP) process to the first and second metal gate stacks using a first slurry, wherein after the performing of the first CMP process, the first metal gate stack has a first height different from a second height of the second metal gate stack;
forming first cut metal gates (CMGs) in the dummy region and second CMGs in the active device region, wherein the second CMGs are different from the first CMGs in composition; and
performing a second CMP process to the first and second CMGs using a second slurry.

16. The method of claim 15, further comprising tuning each of the first slurry and the second slurry according to a respective polish surface.

17. The method of claim 15, wherein
the first CMGs in the dummy region includes silicon nitride (SiN) with a first pattern density;
the second CMGs in the active device region includes a second pattern density less than the first pattern density;
the second slurry has a first polish rate to SiN greater than a second polish rate to silicon oxide ($SiO_2$); and
the first height is less than the second height.

18. The method of claim 15, wherein
the first CMGs in the dummy region includes SiN with a first pattern density;
the second CMGs in the active device region includes a second pattern density less than the first pattern density;
the second slurry has a first polish rate to SiN less than a second polish rate to $SiO_2$; and
the first height is greater than the second height.

19. The method of claim 16, wherein
the first CMGs in the dummy region includes $SiO_2$ with a first pattern density;

the second CMGs in the active device region includes a second pattern density less than the first pattern density;

the second slurry has a first polish rate to SiN greater than a second polish rate to $SiO_2$; and the first height is greater than the second height.

20. The method of claim 16, wherein the first CMGs in the dummy region includes $SiO_2$ with a first pattern density;

the second CMGs in the active device region includes a second pattern density less than the first pattern density;

the second slurry has a first polish rate to SiN less than a second polish rate to $SiO_2$; and the first height is less than the second height.

* * * * *